US012696788B2

(12) United States Patent
Fuji

(10) Patent No.: US 12,696,788 B2
(45) Date of Patent: Jul. 28, 2026

(54) SEMICONDUCTOR DEVICE AND METHOD FOR MANUFACTURING SEMICONDUCTOR DEVICE

(71) Applicant: ROHM CO., LTD., Kyoto (JP)

(72) Inventor: Kazunori Fuji, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 709 days.

(21) Appl. No.: 17/596,359

(22) PCT Filed: May 25, 2020

(86) PCT No.: PCT/JP2020/020634
§ 371 (c)(1),
(2) Date: Dec. 8, 2021

(87) PCT Pub. No.: WO2020/250660
PCT Pub. Date: Dec. 17, 2020

(65) Prior Publication Data
US 2022/0230983 A1       Jul. 21, 2022

(30) Foreign Application Priority Data

Jun. 14, 2019    (JP) ................................. 2019-111378

(51) Int. Cl.
| | |
|---|---|
| *H10W 74/01* | (2026.01) |
| *H10W 70/09* | (2026.01) |
| *H10W 70/60* | (2026.01) |
| *H10W 72/00* | (2026.01) |
| *H10W 74/10* | (2026.01) |
| *H10W 74/40* | (2026.01) |

(52) U.S. Cl.
CPC ......... *H10W 74/014* (2026.01); *H10W 70/09* (2026.01); *H10W 72/0198* (2026.01); (Continued)

(58) Field of Classification Search
CPC ........... H01L 21/561; H01L 2224/2101; H01L 2224/32225; H01L 2224/4805; (Continued)

(56) References Cited

U.S. PATENT DOCUMENTS

| | | | |
|---|---|---|---|
| 2003/0218233 A1 | 11/2003 | Ueda et al. | |
| 2015/0162309 A1* | 6/2015 | Vincent ................... | H01L 24/97 |
| | | | 438/109 |
| 2019/0148254 A1* | 5/2019 | Na ........................... | H01L 24/26 |
| | | | 257/774 |

FOREIGN PATENT DOCUMENTS

| | | |
|---|---|---|
| JP | 2014110337 | 6/2014 |
| JP | 2016089081 | 5/2016 |
| JP | 2017188825 | 10/2017 |

OTHER PUBLICATIONS

"3D LDS Components: New Opportunities in PCB Layout and Production" by Malte Borges in "the pcb magazine" (Year: 2014).*

(Continued)

*Primary Examiner* — Julio J Maldonado
*Assistant Examiner* — Nathan Pridemore
(74) *Attorney, Agent, or Firm* — HSML P.C.

(57) ABSTRACT

A semiconductor device includes an insulation layer, wires, a semiconductor element, and an encapsulation resin. The insulation layer includes a main surface and a back surface facing opposite in a thickness-wise direction and a side surface formed between the main surface and the back surface in the thickness-wise direction. The wires include an embedded portion embedded in the insulation layer and a redistribution portion formed of a metal film joined to the embedded portion and formed from the back surface to the side surface. The semiconductor element is mounted on the main surface and includes electrodes joined to at least part of the embedded portion of the wires. The encapsulation resin contacts the main surface and covers the semiconductor element.

13 Claims, 33 Drawing Sheets

(52) U.S. Cl.
CPC .......... *H10W 74/129* (2026.01); *H10W 70/60* (2026.01); *H10W 74/40* (2026.01)

(58) Field of Classification Search
CPC ..... H01L 23/3114; H01L 24/19; H01L 24/20; H01L 24/96; H01L 2924/181; H01L 2924/186; H01L 23/3107; H01L 23/3121; H01L 2224/02371; H01L 2924/1815; H01L 23/49838; H01L 23/495; H01L 23/498; H01L 23/055; H10W 70/09; H10W 76/153
See application file for complete search history.

(56) References Cited

OTHER PUBLICATIONS

"Advanced Antennas for Mobile Phones" by Markku Kivikoski et al. (Year: 2015).*

International Search Report and Written Opinion issued for International Patent Application No. PCT/JP2020/020634, Date of mailing: Aug. 11, 2020, 11 pages including English translation of Search Report.

Notice of Reasons for Refusal issued for Japanese Patent Application No. 2021-525972, Dispatch Date: Apr. 2, 2024, 11 pages including English machine translation.

International Preliminary Report on Patentability issued for International Patent Application No. PCT/JP2020/020634, Date of issuance: Dec. 14, 2021, 12 pages including English translation.

First Office Action issued for Chinese Patent Application No. 202080042684.5, dated Apr. 30, 2025, 22 pages including English machine translation.

Second Office Action issued for Chinese Patent Application No. 202080042684.5, dated Jan. 29, 2026, 26 pages including English machine translation.

Office Action issued for Chinese Patent Application No. 202080042684.5, dated Apr. 30, 2026, 26 pages including English machine translation.

* cited by examiner

SEMICONDUCTOR DEVICE AND METHOD FOR MANUFACTURING SEMICONDUCTOR DEVICE

TECHNICAL FIELD

The present disclosure is related to a semiconductor device and a method for manufacturing a semiconductor device.

BACKGROUND ART

Reduction in size of a semiconductor device used for a recent electronic apparatus is advancing in accordance with reduction in size of the electronic apparatus. There have been proposals to use a fan-out type semiconductor device, which includes a semiconductor element having electrodes formed on a back surface, an insulation layer covering the back surface of the semiconductor element, and wires formed on the insulation layer and electrically connected to the electrodes. The wires are disposed outward from the semiconductor element. Thus, the semiconductor device is reduced in size and corresponds to the shape of wiring patterns of a wiring substrate on which the semiconductor device is mounted.

PRIOR ART DOCUMENT

Patent Document

Patent Document 1: Japanese Laid-Open Patent Publication No. 2016-89081

SUMMARY OF THE INVENTION

Problems that the Invention is to Solve

Patent Document 1 discloses an example of a semiconductor device in which terminals are exposed from the back surface of the insulation layer and connected to wires. When solder is used to mount the semiconductor device on a wiring substrate, the solder is not readily visible from the outside of the semiconductor device. Hence, there is room for improvement in visual recognition of a mount state of a semiconductor device on a wiring substrate based on a bonding state of the semiconductor device to the wiring substrate with solder.

It is an objective of the present disclosure to provide a semiconductor device and a method for manufacturing a semiconductor device that allow for easy recognition of a mount state of the semiconductor device on a wiring substrate.

Means for Solving the Problems

To achieve the above objective, a semiconductor device includes an insulation layer, wires, a semiconductor element, and an encapsulation resin. The insulation layer includes a main surface, a back surface, and a side surface. The main surface and the back surface face in opposite directions in a thickness-wise direction. The side surface is formed between the main surface and the back surface in the thickness-wise direction. The wires include an embedded portion and a redistribution portion. At least part of the embedded portion is embedded in the insulation layer. The redistribution portion is formed of a metal film joined to the embedded portion and formed from the back surface to the side surface. The semiconductor element is mounted on the main surface and includes electrodes joined to at least part of the embedded portion of the wires. The encapsulation resin is in contact with the main surface and covers the semiconductor element.

In this structure, when the semiconductor device is mounted on a wiring substrate with solder, the solder collects on the redistribution portion formed on the side surface of the insulation layer to form a solder fillet. The solder fillet exposed to the outside of the semiconductor device allows for visual recognition of the solder that bonds the semiconductor device to the wiring substrate. This facilitates visual recognition of the mount state of the semiconductor device.

To achieve the above objective, a semiconductor device includes a first insulation layer, a second insulation layer, a first embedded portion, a first redistribution portion, a second embedded portion, a second redistribution portion, a semiconductor element, and an encapsulation resin. The first insulation layer includes a first main surface, a first back surface, and a first side surface. The first main surface and the first back surface face in opposite directions in a thickness-wise direction. The first side surface is formed between the first main surface and the first back surface in the thickness-wise direction. The second insulation layer is stacked on the first insulation layer in the thickness-wise direction and includes a second main surface, a second back surface, and a second side surface. The second main surface and the second back surface face in opposite directions in the thickness-wise direction. The second side surface is formed between the second main surface and the second back surface in the thickness-wise direction. The first embedded portion is at least partially embedded in the first insulation layer. The first redistribution portion is formed of a metal film joined to the first embedded portion and formed on at least the first back surface of the first insulation layer. The second embedded portion is at least partially embedded in the second insulation layer and is joined to the first redistribution portion. The second redistribution portion is formed of a metal film joined to the second embedded portion and formed from the second back surface to the second side surface. The semiconductor element is mounted on the first main surface and includes an electrode joined to at least part of the first embedded portion. The encapsulation resin is in contact with the first main surface and covers the semiconductor element.

In this structure, when the semiconductor device is mounted on a wiring substrate with solder, the solder collects on the second redistribution portion formed on the second side surface of the second insulation layer to form a solder fillet. The solder fillet exposed to the outside of the semiconductor device allows for visual recognition of the solder that bonds the semiconductor device to the wiring substrate. This facilitates visual recognition of the mount state of the semiconductor device.

To achieve the above objective, a method for manufacturing a semiconductor device includes an element embedding step of embedding a semiconductor element in an encapsulation resin so that an electrode disposed on a side of the semiconductor element in a thickness-wise direction is exposed from a resin back surface, an insulation layer forming step of forming an insulation layer including a main surface and a back surface facing in opposite directions, the main surface covering the resin back surface of the encapsulation resin and the electrode, a side surface forming step of forming a side surface in the insulation layer that intersects the back surface, and a wire forming step of forming an embedded portion embedded in the insulation layer and joined to the electrode and a redistribution portion formed from the back surface to the side surface.

In this structure, when the semiconductor device is mounted on a wiring substrate with solder, the solder collects on the redistribution portion formed on the side surface of the insulation layer to form a solder fillet. The solder fillet exposed to the outside of the semiconductor device allows for visual recognition of the solder that bonds the semiconductor device to the wiring substrate. This facilitates visual recognition of the mount state of the semiconductor device.

Effects of the Invention

The semiconductor device and the method for manufacturing the semiconductor device allow for easy recognition of the mount state of the semiconductor device on a wiring substrate.

MODES FOR CARRYING OUT THE INVENTION

Embodiments of a semiconductor device and a method for manufacturing a semiconductor device will be described below with reference to the drawings. The embodiments described below exemplify configurations and methods for embodying a technical concept and are not intended to limit the material, shape, structure, layout, dimensions, and the like of each component to those described below. The embodiments described below may undergo various modifications.

Embodiments

Semiconductor Device Structure
The structure of an embodiment of a semiconductor device will now be described with reference to FIGS. 1 to 6.

Figure 1:
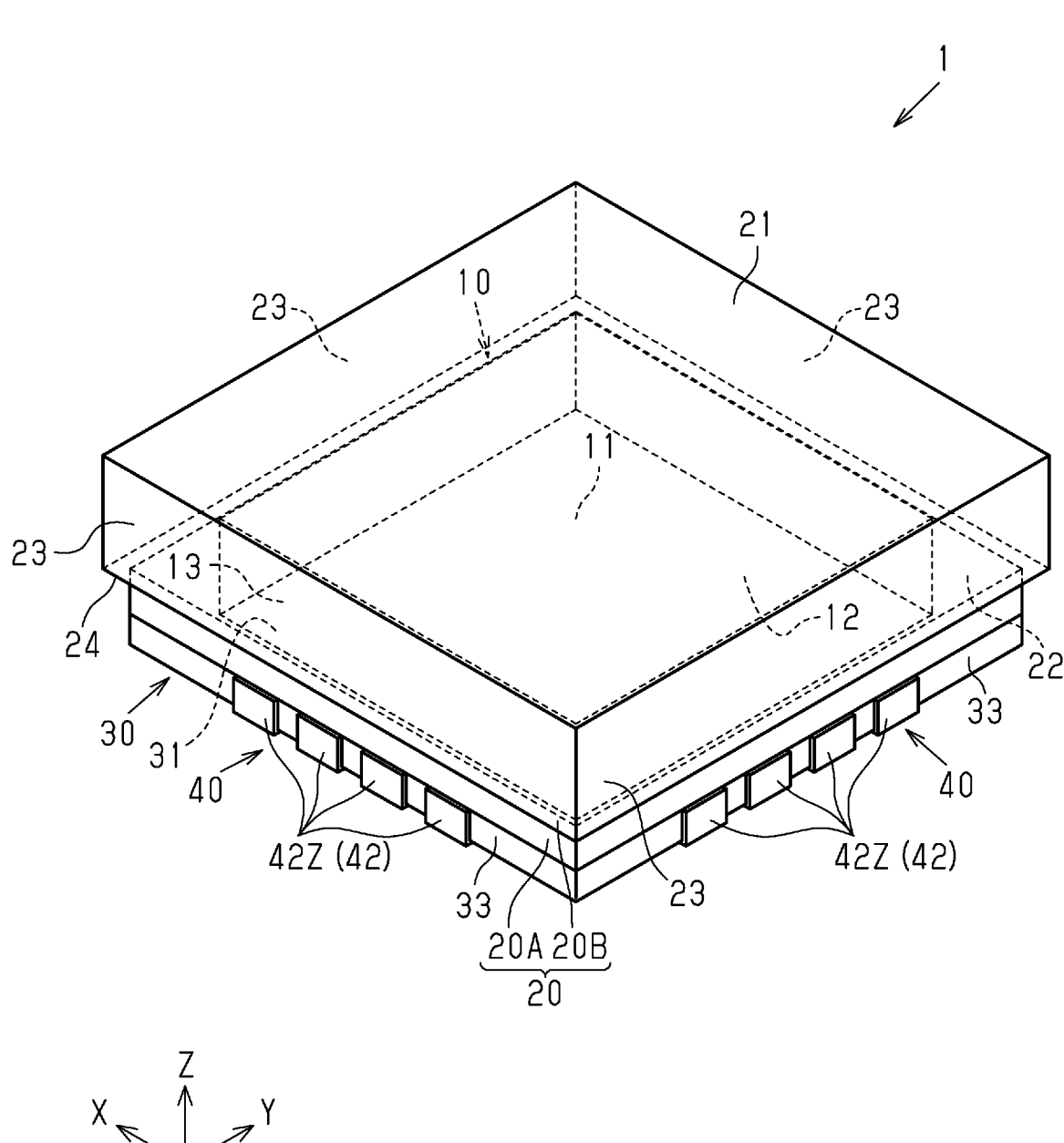
FIG. 1 is a perspective view showing an embodiment of a semiconductor device.
Figure 2:
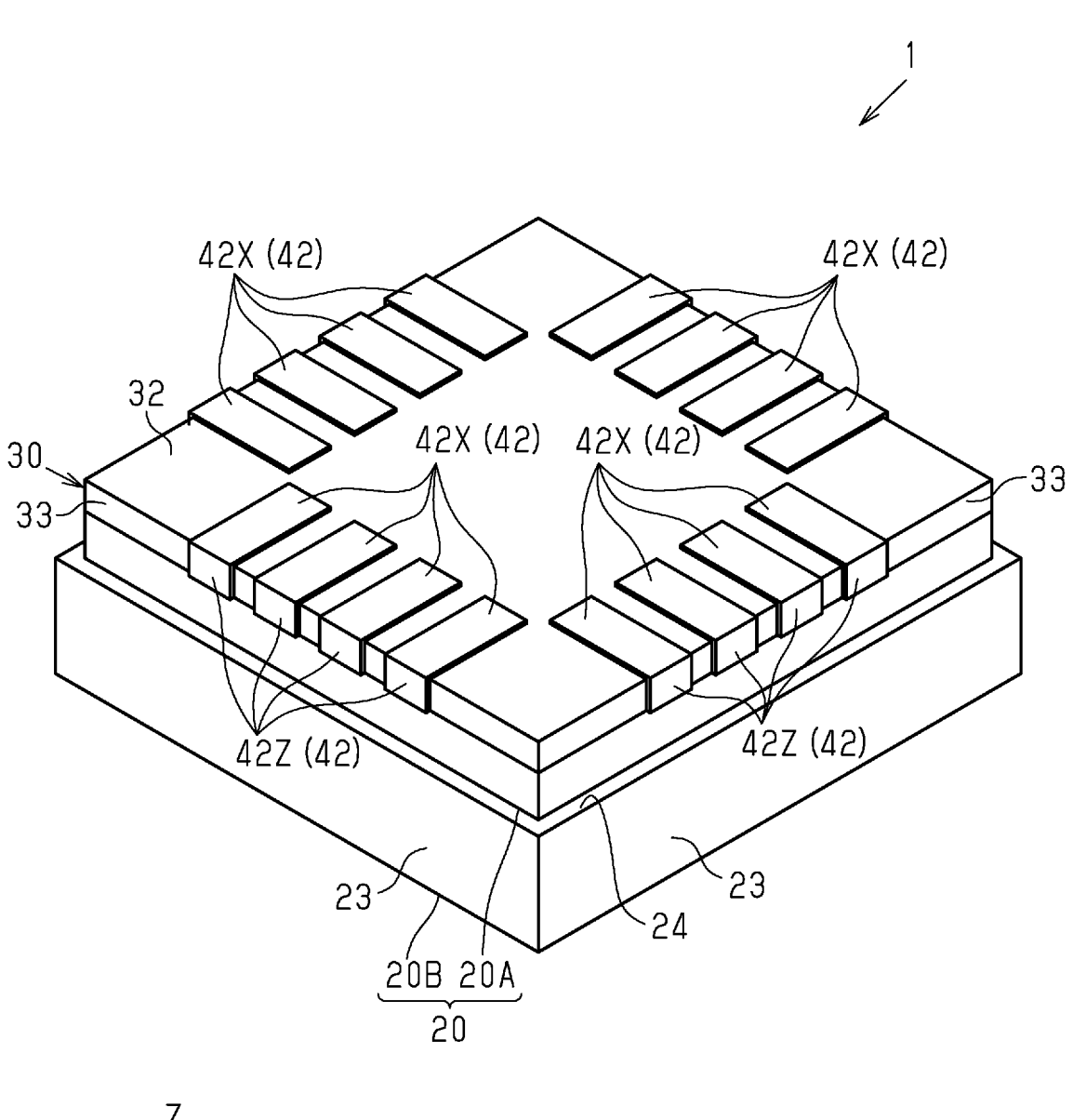
FIG. 2 is a perspective view of the semiconductor device shown in FIG. 1 from a back surface side.

As shown in FIGS. 1 and 2, a semiconductor device 1 includes a semiconductor element 10, an encapsulation resin 20 encapsulating part of the semiconductor element 10, an insulation layer 30 formed on the encapsulation resin 20, and wires 40 formed on the insulation layer 30. The semiconductor device 1 is a fan-out type package mounted on the surface of a wiring substrate.

In the description hereafter, the stacking direction of the encapsulation resin 20 and the insulation layer 30 is referred to as "the thickness-wise direction Z." A predetermined direction orthogonal to the thickness-wise direction Z is referred to as "the width-wise direction X." The direction orthogonal to the thickness-wise direction Z and the width-wise direction X is referred to as "the length-wise direction Y." In the thickness-wise direction Z, a view from the encapsulation resin 20 toward the insulation layer 30 is referred to as "plan view."

The semiconductor element 10 is an integrated circuit (IC) and is, for example, a large scale integration (LSI). Further, the semiconductor element 10 may be a voltage-controlled circuit such as a low dropout (LDO) regulator, an amplifying element such as an operational amplifier, or a discrete semiconductor such as a diode. The semiconductor element 10 is rectangular in plan view. In the present embodiment, the semiconductor element 10 is square in plan view. The semiconductor element 10 is a flip-chip-type element.

Figure 3:
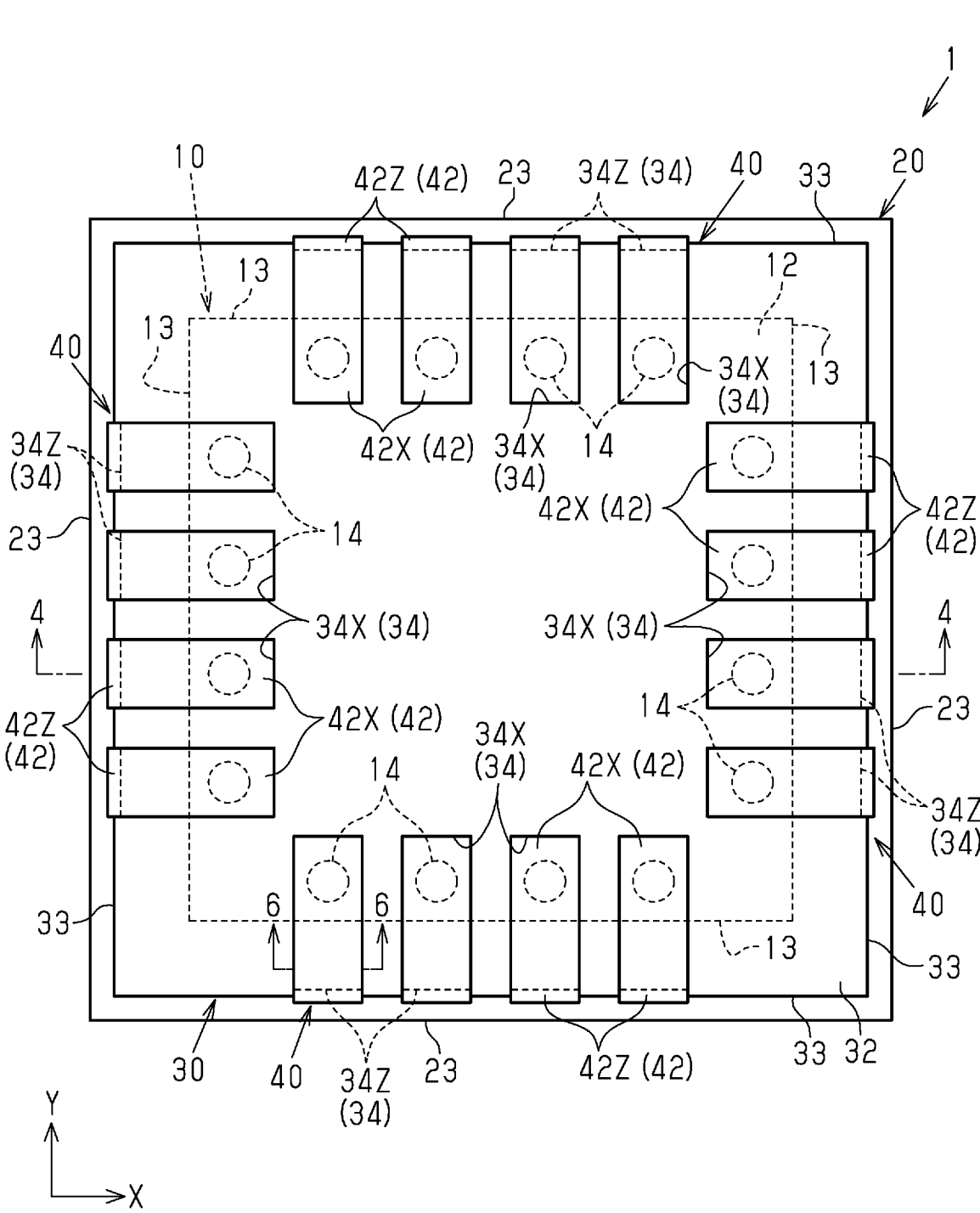
FIG. 3 is a rear view of the semiconductor device shown in FIG. 1.

The semiconductor element 10 includes an element main surface 11, an element back surface 12, and element side surfaces 13. The element main surface 11 and the element back surface 12 face in opposite directions in the thickness-wise direction Z. The element side surfaces 13 are formed between the element main surface 11 and the element back surface 12 in the thickness-wise direction Z. The element side surfaces 13 intersect the element main surface 11 and the element back surface 12. As shown in FIG. 3, electrodes 14 (in the present embodiment, sixteen electrodes) are formed on the element back surface 12. The electrodes 14 are electrically connected to a circuit formed in the semiconductor element 10. The electrodes 14 include, for example, aluminum (Al). As shown in FIG. 3, in the present embodiment, in plan view, four electrodes 14 are arranged along each element side surface 13 and are separate from each other. The number of electrodes 14 may be changed in any manner.

As shown in FIGS. 1 to 4, the encapsulation resin 20 covers part of the semiconductor element 10. Specifically, the encapsulation resin 20 covers the element main surface 11 and the element side surfaces 13 of the semiconductor element 10. The element back surface 12 and the electrodes 14 of the semiconductor element 10 are exposed from the encapsulation resin 20. The encapsulation resin 20 is formed from, for example, a material including a black epoxy resin. The encapsulation resin 20 includes a resin main surface 21, a resin back surface 22, and resin side surfaces 23 (in the present embodiment, four side surfaces). The resin main surface 21 and the element main surface 11 of the semiconductor element 10 face in the same direction. The resin back surface 22 and the element back surface 12 of the semiconductor element 10 face in the same direction. The resin side surfaces 23 intersect the resin main surface 21 and the resin back surface 22. The resin side surfaces 23 and the element side surfaces 13 of the semiconductor element 10 respectively face in the same directions.

Figure 4:
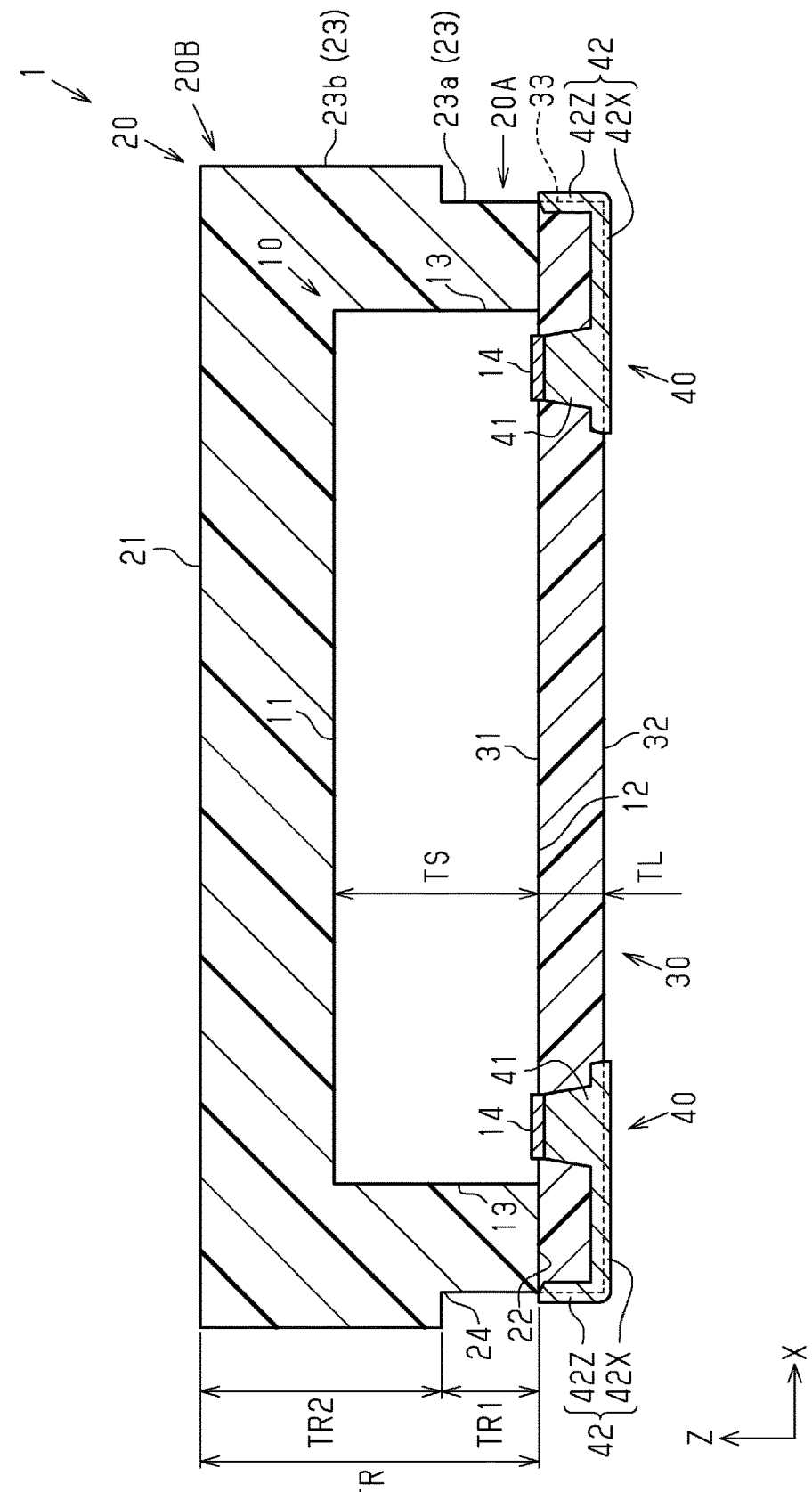
FIG. 4 is a schematic cross-sectional view taken along line 4-4 in FIG. 3.

As shown in FIG. 4, the encapsulation resin 20 includes a portion located toward the insulation layer 30 in the thickness-wise direction Z defining a first resin portion 20A, and a portion located at a side opposite from the insulation layer 30 in the thickness-wise direction Z defining a second resin portion 20B. The first resin portion 20A includes first resin side surfaces 23a forming part of the resin side surfaces 23. The second resin portion 20B is larger than the first resin portion 20A in a direction orthogonal to the thickness-wise direction Z. The second resin portion 20B includes second resin side surfaces 23b forming part of the resin side surfaces 23. The first resin side surfaces 23a are disposed inward from the second resin side surfaces 23b. Thus, the encapsulation resin 20 includes a step 24 formed by the difference in size between the first resin portion 20A and the second resin portion 20B. The step 24 is recessed inside the encapsulation resin 20. The step 24 extends along the entire perimeter of the encapsulation resin 20.

In the present embodiment, the thickness TR1 of the first resin portion 20A is less than the thickness TR2 of the second resin portion 20B. In addition, the thickness TR1 is less than the thickness TS of the semiconductor element 10. The back surface of the first resin portion 20A defines the resin back surface 22. The main surface of the second resin portion 20B defines the resin main surface 21. As shown in FIG. 4, in the present embodiment, the resin back surface 22 is flush with the element back surface 12 of the semiconductor element 10. The electrodes 14 of the semiconductor element 10 project beyond the resin back surface 22 toward the insulation layer 30.

As shown in FIGS. 2 to 4, the insulation layer 30 is flat and is in contact with the resin back surface 22 of the encapsulation resin 20. The insulation layer 30 covers the element back surface 12 and the electrodes 14 of the semiconductor element 10. Thus, the semiconductor element 10 is encapsulated by the encapsulation resin 20 and the insulation layer 30. The insulation layer 30 is formed from a material including a thermosetting synthetic resin and an additive containing a metallic element that forms part of the wires 40. The synthetic resin included in the insulation layer 30 is, for example, an epoxy resin or a polyimide resin. The insulation layer 30 is substantially equal to the first resin portion 20A in the dimensions in the width-wise direction X and the length-wise direction Y. The thickness TL of the insulation layer 30 is less than the thickness TR of the encapsulation resin 20. The thickness TL is less than the thickness TS of the semiconductor element 10. The thickness TL is less than the thickness TR2 of the second resin portion 20B. The thickness TL is less than the thickness TR1 of the first resin portion 20A. The thickness TR1 of the first resin portion 20A and the thickness TR2 of the second resin portion 20B may be changed in any manner. For example, the thickness TR2 may be greater than or equal to the thickness TR1. The relationship of the thickness TS of the semiconductor element 10 with the thicknesses TR1 and TR2 may be changed in any manner. For example, the thickness TS may be less than or equal to the thickness TR1 or greater than or equal to the thickness TR2.

The insulation layer 30 includes a main surface 31, a back surface 32, and side surfaces 33. The main surface 31 and the back surface 32 face in opposite directions in the thickness-wise direction Z. The main surface 31 is in contact with the element back surface 12 of the semiconductor element 10. When the semiconductor device 1 is mounted on a wiring substrate, the back surface 32 is opposed to the wiring substrate. Each side surface 33 is formed between the main surface 31 and the back surface 32 in the thickness-wise direction Z. The side surface 33 is joined to both the main surface 31 and the back surface 32. In the present embodiment, each side surface 33 faces in the width-wise direction X or the length-wise direction Y. The side surface 33 intersects the main surface 31 and the back surface 32. The side surfaces 33 and the resin side surfaces 23 (the first resin side surfaces 23a and the second resin side surfaces 23b) of the encapsulation resin 20 respectively face in the same directions.

Figure 5:
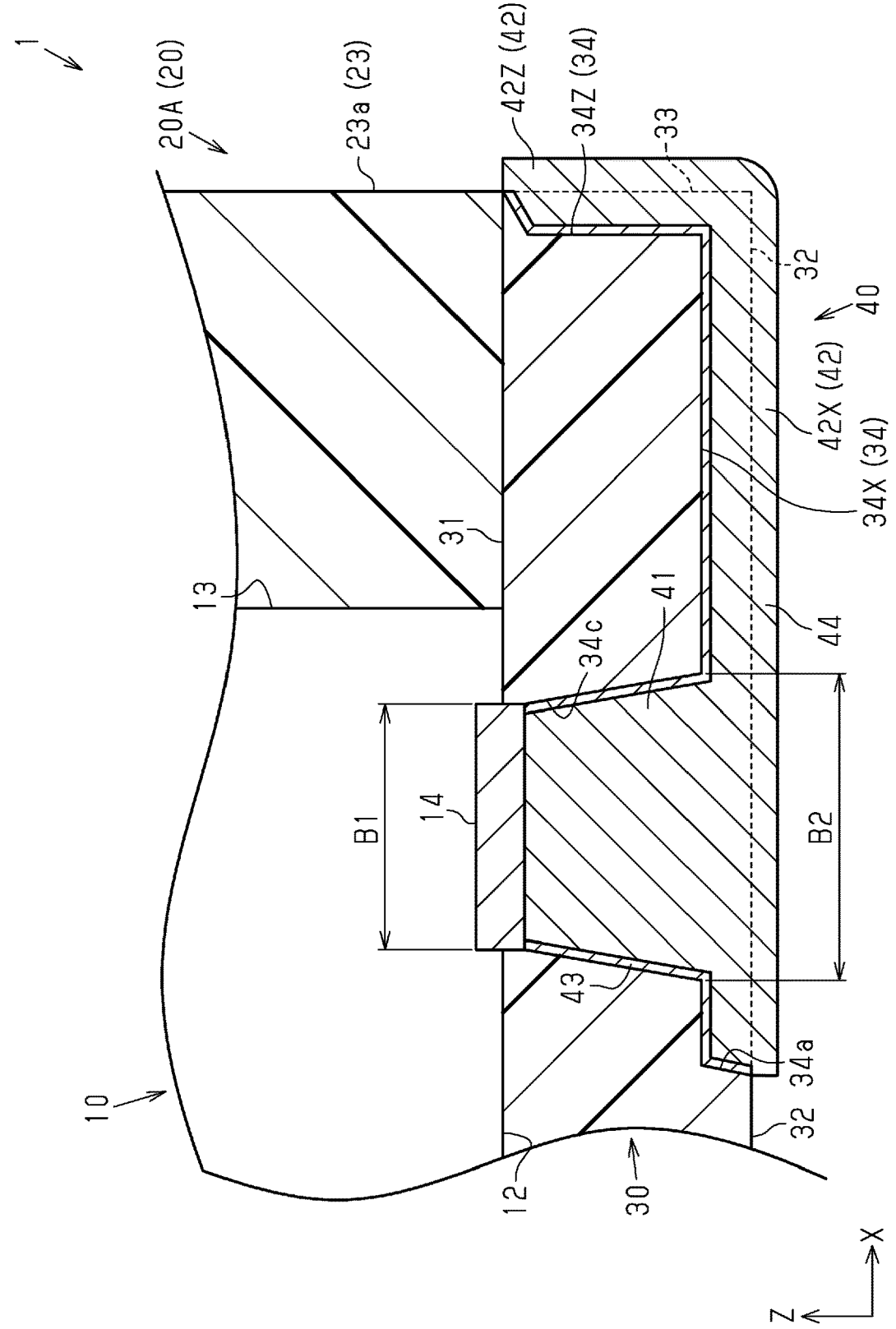
FIG. 5 is an enlarged view of FIG. 4 showing a portion of wires and its surroundings.

As shown in FIG. 5, the insulation layer 30 includes grooves 34 (in the present embodiment, sixteen grooves). In the present embodiment, the grooves 34 are identical to each other in shape. As viewed in the thickness-wise direction Z, the grooves 34 include parts overlapping with the electrodes 14 of the semiconductor element 10.

Each groove 34 includes a back groove 34X, which is recessed from the back surface 32 toward the main surface 31 in the thickness-wise direction Z, and a side groove 34Z, which is recessed from the side surface 33 toward another side surface 33 that is opposed in the width-wise direction X or the length-wise direction Y Each groove 34 includes side surfaces inclined from the bottom surface of the groove 34 to an open end of the groove 34 so that the width of the groove 34 is gradually increased.

Figure 6:
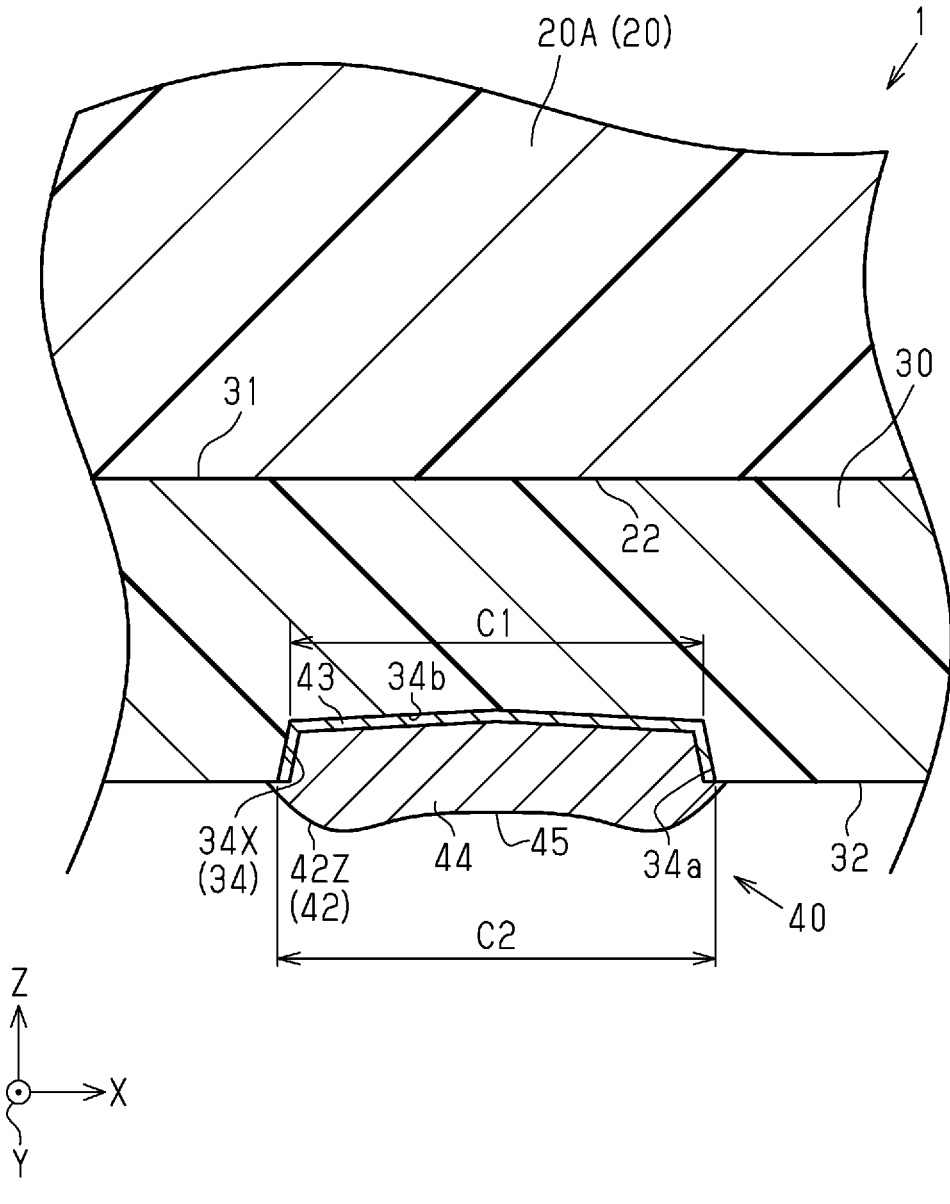
FIG. 6 is a schematic cross-sectional view taken along line 6-6 in FIG. 3.

FIG. 6 is a cross-sectional view of a back groove 34X that is cut along a plane extending in the width-wise direction of the back groove 34X and the thickness-wise direction Z. As shown in FIG. 6, the back groove 34X includes a side surface 34a and a bottom surface 34b. The side surface 34a is inclined so that the width of the back groove 34X is gradually increased from the bottom surface 34b to the back surface 32 of the insulation layer 30. The bottom surface 34b of the back groove 34X has a dimension C1 in the width-wise direction X (width-wise direction of the back groove 34X). The border of the back surface 32 with the side surface 34a has a dimension C2 between positions separated from each other in the width-wise direction X (width-wise direction of the back groove 34X). The dimension C1 is less than the dimension C2. Although not shown in the drawings, in the same manner as the back groove 34X, each side groove 34Z includes a side surface that is inclined so that the width of the side groove 34Z is gradually increased from a bottom surface of the side groove 34Z to the side surface 33 of the insulation layer 30.

As shown in FIGS. 3 and 5, as viewed in the thickness-wise direction Z, the back grooves 34X overlap with the electrodes 14 of the semiconductor element 10. Each back groove 34X extends from a part of the back surface 32 located inward from the electrode 14 of the semiconductor element 10 to an edge of the back surface 32 in the width-wise direction X or the length-wise direction Y As shown in FIG. 3, in the present embodiment, in plan view, four back grooves 34X are arranged along each side surface 33 and are separate from each other.

As shown in FIG. 5, the side groove 34Z is formed in the entirety of the side surface 33 in the thickness-wise direction Z. The side groove 34Z is continuous with the back groove 34X. That is, as shown in FIG. 3, in plan view, fourth side grooves 34Z are arranged along each side surface 33 and are separate from each other. The side grooves 34Z are formed in a portion of the side surface 33 of the insulation layer 30 that is located inward from the first resin side surface 23a of the first resin portion 20A. The side surface 33 of the insulation layer 30 where the side grooves 34Z are not formed is flush with the first resin side surface 23a.

Each groove 34 has a hole 34c in a portion overlapping the electrode 14 of the semiconductor element 10 in the thickness-wise direction Z. The wall surface of the hole 34c is joined to the electrode 14. The hole 34c is defined by a wall surface that is inclined so that the diameter of the hole 34c is gradually increased from the main surface 31 of the insulation layer 30 to the back groove 34X. The hole 34c has a dimension B1 in a direction orthogonal to the thickness-wise direction Z at a location closest to the electrode 14 and a dimension B2 in the direction orthogonal to the thickness-wise direction Z at a location closest to the back surface 32. The dimension B1 is less than the dimension B2.

As shown in FIG. 3, the wires 40 are electrically connected to the electrodes 14 of the semiconductor element 10. The wires 40 form conductive paths for supplying power to the semiconductor element 10 and inputting and outputting a signal to and from the semiconductor element 10.

As shown in FIGS. 4 to 6, the wires 40 are disposed on the insulation layer 30. In the present embodiment, the wires 40 are formed on the insulation layer 30. The wires 40 are disposed in the grooves 34. As shown in FIGS. 4 and 5, each wire 40 includes an embedded portion 41 and a redistribution portion 42.

At least part of the embedded portion 41 is embedded in the insulation layer 30. In the present embodiment, the entirety of the embedded portion 41 is embedded in the insulation layer 30. As shown in FIG. 5, in the present embodiment, the embedded portion 41 is embedded in the hole 34c. The embedded portion 41 includes a side surface shaped in conformance with the shape of the wall surface defining the hole 34c. That is, the side surface of the embedded portion 41 is inclined so that the diameter of the embedded portion 41 is gradually increased from the main surface 31 of the insulation layer 30 toward the back groove 34X. The shape of the side surface of the embedded portion 41 is identical to the shape of the wall surface defining the hole 34c. The embedded portion 41 is joined to the electrode 14 of the semiconductor element 10.

The redistribution portion 42 is joined to the embedded portion 41. The redistribution portion 42 is disposed in the back groove 34X and the side groove 34Z. As shown in FIG. 3, each redistribution portion 42 includes a part located outward from the semiconductor element 10. The redistribution portion 42 includes a back redistribution portion 42X disposed in the back groove 34X and a side redistribution portion 42Z disposed in the side groove 34Z. As shown in FIG. 3, four back redistribution portions 42X are arranged along each side surface 33 of the insulation layer 30 and are separate from each other. Also, four side redistribution portions 42Z are arranged along each side surface 33 and are separate from each other. The back redistribution portion 42X is joined to the side redistribution portion 42Z. In the present embodiment, the back redistribution portion 42X is formed integrally with the side redistribution portion 42Z. The side redistribution portion 42Z is formed in the entirety of the side surface 33 of the insulation layer 30 in the thickness-wise direction Z.

Each of the embedded portion 41 and the redistribution portion 42 includes a base layer 43 and a plating layer 44. The base layer 43 is formed of a metallic element included in the additive of the insulation layer 30. The plating layer 44 is formed from a material including, for example, copper (Cu). The base layer 43 of the embedded portion 41 is in contact with the wall surface of the hole 34c. The plating layer 44 of the embedded portion 41 is surrounded by the base layer 43 of the embedded portion 41 about the thickness-wise direction Z. The base layer 43 of the redistribution portion 42 is in contact with the back groove 34X. The plating layer 44 of the redistribution portion 42 covers the base layer 43 of the redistribution portion 42. In the present embodiment, the plating layer 44 of the back redistribution portion 42X projects from the back groove 34X in the thickness-wise direction Z. The plating layer 44 of the side redistribution portion 42Z projects from the side groove 34Z in a direction orthogonal to the side surface 33. The plating layer 44 of the side redistribution portion 42Z projects beyond the first resin side surface 23a of the first resin portion 20A in a direction orthogonal to the side surface 33. Thus, the redistribution portion 42 is formed of a metal film including the base layer 43 and the plating layer 44.

FIG. 6 is a cross-sectional view of a redistribution portion 42 that extends in the length-wise direction Y cut along a plane extending in the thickness-wise direction Z and the width-wise direction X. In this case, the width-wise direction of the redistribution portion 42 conforms to the width-wise direction X.

As shown in FIG. 6, the plating layer 44 of the redistribution portion 42 includes a valley 45 that is recessed in the thickness-wise direction of the redistribution portion 42. The valley 45 is a trace of formation of the plating layer 44 on the base layer 43 that covers the groove 34 in a wire forming step in a manufacturing method of the semiconductor device 1, which will be described later. Thus, the valleys 45 extend in directions in which the redistribution portions 42 of the wires 40 extend. Specifically, the valley 45 of the back redistribution portion 42X is recessed in the plating layer 44 of the back redistribution portion 42X in the thickness-wise direction Z. In FIG. 6, since the back redistribution portion 42X extends in the depth-wise direction Y, the valley 45, formed in the plating layer 44 of the back redistribution portion 42X, extends the depth-wise direction Y In addition, although a redistribution portion 42 extending in the width-wise direction X is not shown in FIG. 6, in a cross-sectional view of the redistribution portion 42 cut along a plane extending in the thickness-wise direction Z and the length-wise direction Y, the valley 45 formed in the plating layer 44 extends in the width-wise direction X of the redistribution portion 42. Further, although not shown in the drawings, when the side redistribution portion 42Z is continuous with the back redistribution portion 42X that extends in the width-wise direction X, the valley 45 formed in the side redistribution portion 42Z is recessed in the width-wise direction X of the plating layer 44 of the side redistribution portion 42Z. When the side redistribution portion 42Z is continuous with the back redistribution portion 42X that extends in the length-wise direction Y, the valley 45 formed in the side redistribution portion 42Z is recessed in the length-wise direction Y of the plating layer 44 of the side redistribution portion 42Z. Since the side redistribution portion 42Z extends in the thickness-wise direction Z, the valley 45 of the side redistribution portion 42Z extends in the thickness-wise direction Z.

Semiconductor Device Manufacturing Method

A method for manufacturing the semiconductor device 1 will now be described with reference to FIGS. 7 and 8A to 8I.

Figure 7:
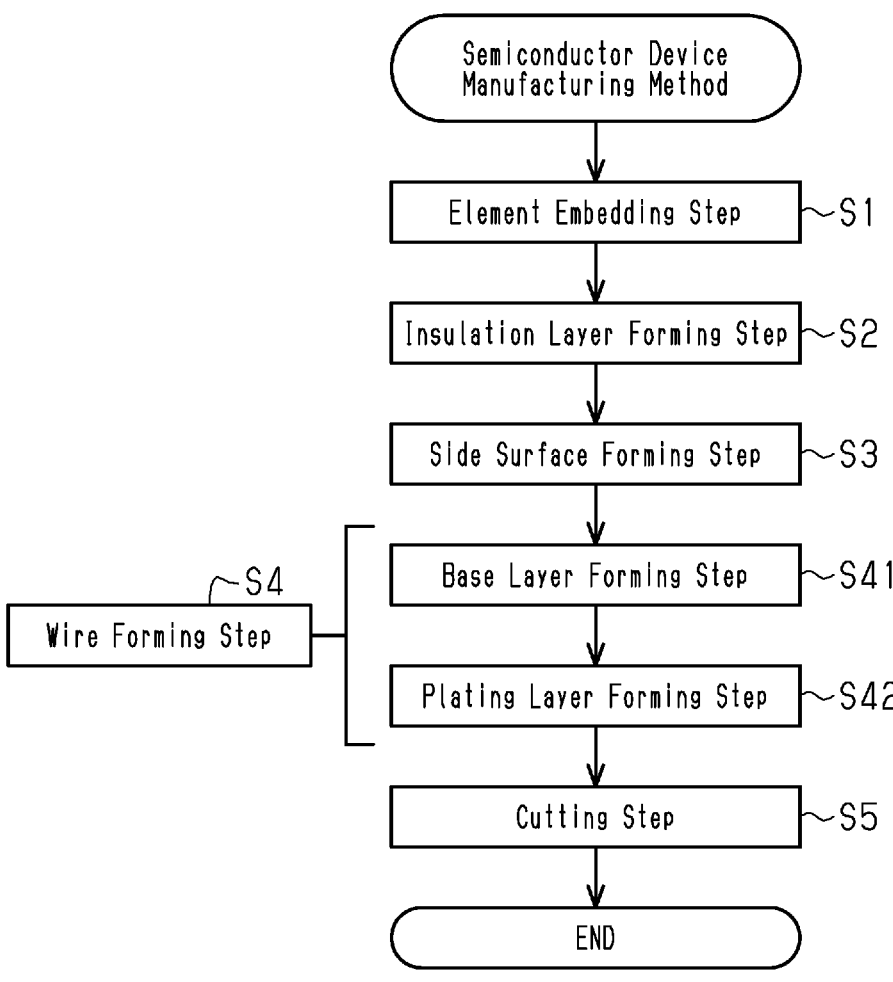
FIG. 7 is a flowchart showing an example of a method for manufacturing a semiconductor device.

As shown in FIG. 7, the method for manufacturing the semiconductor device 1 includes an element embedding step (step S1), an insulation layer forming step (step S2), a side surface forming step (step S3), a wire forming step (step S4), and a cutting step (step S5). In the present embodiment, the element embedding step (step S1), the insulation layer forming step (step S2), the side surface forming step (step S3), the wire forming step (step S4), and the cutting step (step S5) are sequentially executed to manufacture the semiconductor device 1.

Figure 8A:
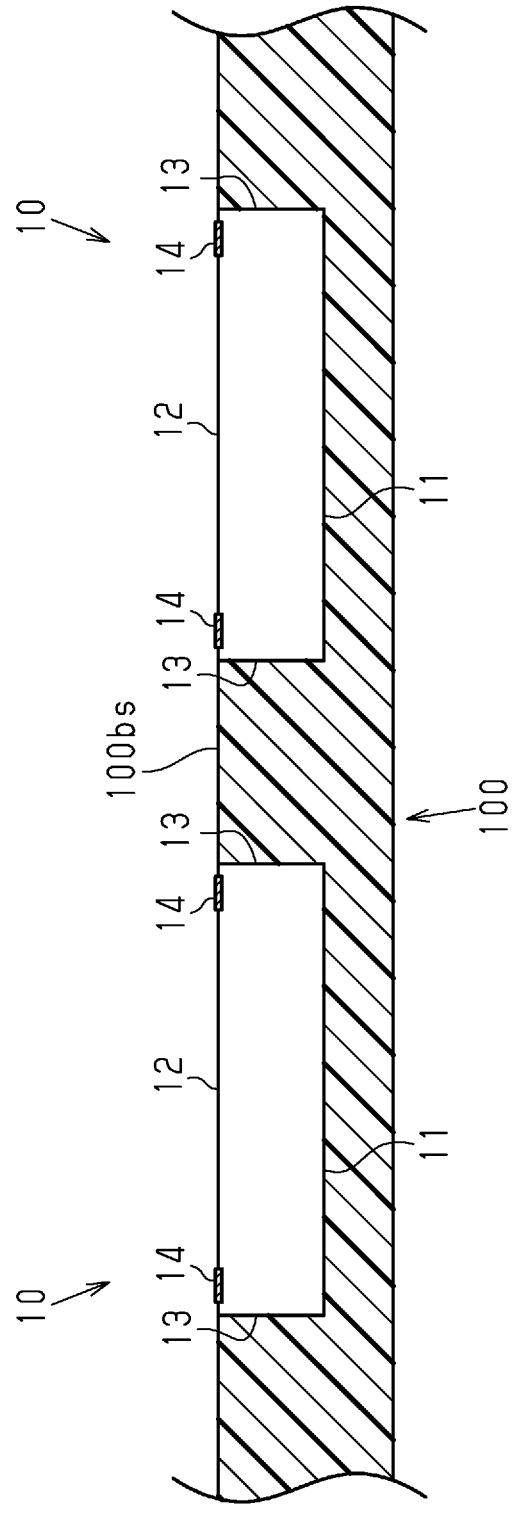
FIG. 8A is a diagram showing an example of an element embedding step in the manufacturing method of the semiconductor device.
Figure 8A:
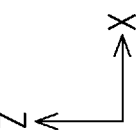

As shown in FIG. 8A, in the element embedding step, semiconductor elements 10 are embedded in an encapsulation resin 100. In this step, the material of the encapsulation resin 100 and the semiconductor elements 10 are disposed in a mold and then undergo compression molding. A material including a black epoxy resin is used as the material of the encapsulation resin 100. In this step, each semiconductor element 10 is embedded in the encapsulation resin 100 so that part of the semiconductor element 10 located toward the element main surface 11 is embedded in the encapsulation resin 100 and that the element back surface 12 and the electrodes 14 formed on the element back surface 12 are exposed from the encapsulation resin 100. As shown in FIG. 8A, the element main surface 11 and the element side surfaces 13 of each semiconductor element 10 are covered by the encapsulation resin 100. The encapsulation resin 100 includes a resin back surface 100bs that is flush with the element back surface 12. The electrodes 14 project from the resin back surface 100bs in the thickness-wise direction Z.

Figure 8B:
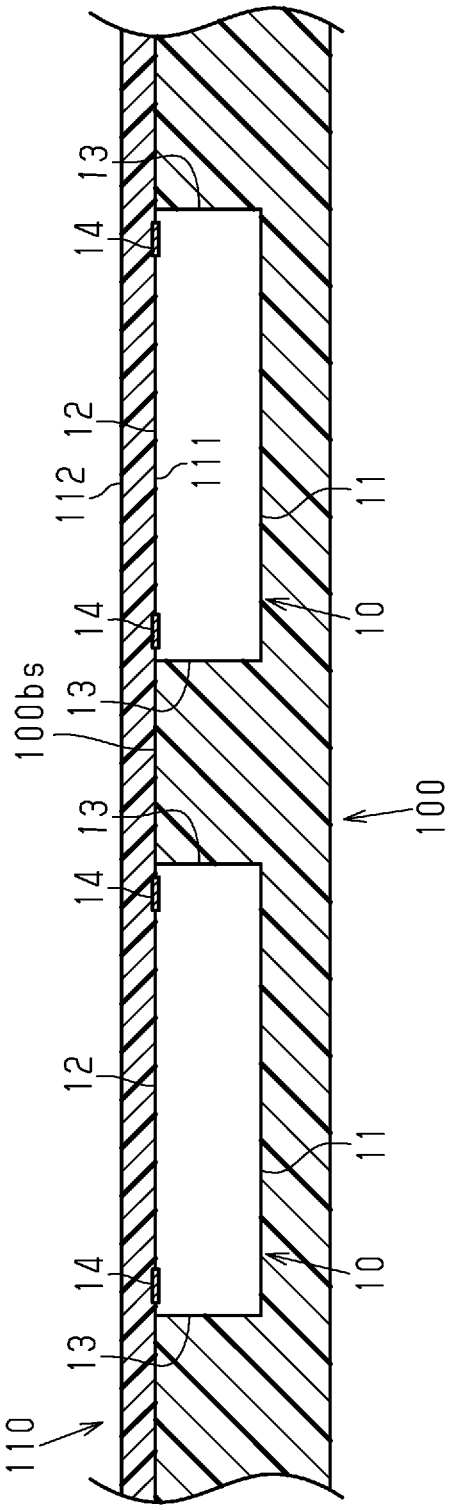
FIG. 8B is a diagram showing an example of an insulation layer forming step in the manufacturing method of the semiconductor device.
Figure 8B:
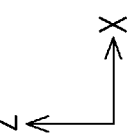

As shown in FIG. 8B, in the insulation layer forming step, an insulation layer 110 is stacked on the resin back surface 100bs of the encapsulation resin 100 and covers the element back surface 12 and the electrodes 14 of each semiconductor element 10. The insulation layer 110 is formed from a material including a thermosetting synthetic resin and an additive containing a metallic element that forms part of wires 120, which will be described later. The synthetic resin of the insulation layer 110 is, for example, an epoxy resin or a polyimide resin. The insulation layer 110 is formed through compression molding. The insulation layer 110 includes a main surface 111 and a back surface 112 facing in opposite directions in the thickness-wise direction Z. The main surface 111 is a surface of the insulation layer 110 located at a side of the encapsulation resin 100. The back surface 112 is a surface of the insulation layer 110 located at a side opposite from the encapsulation resin 100 in the thickness-wise direction Z.

Figure 8C:
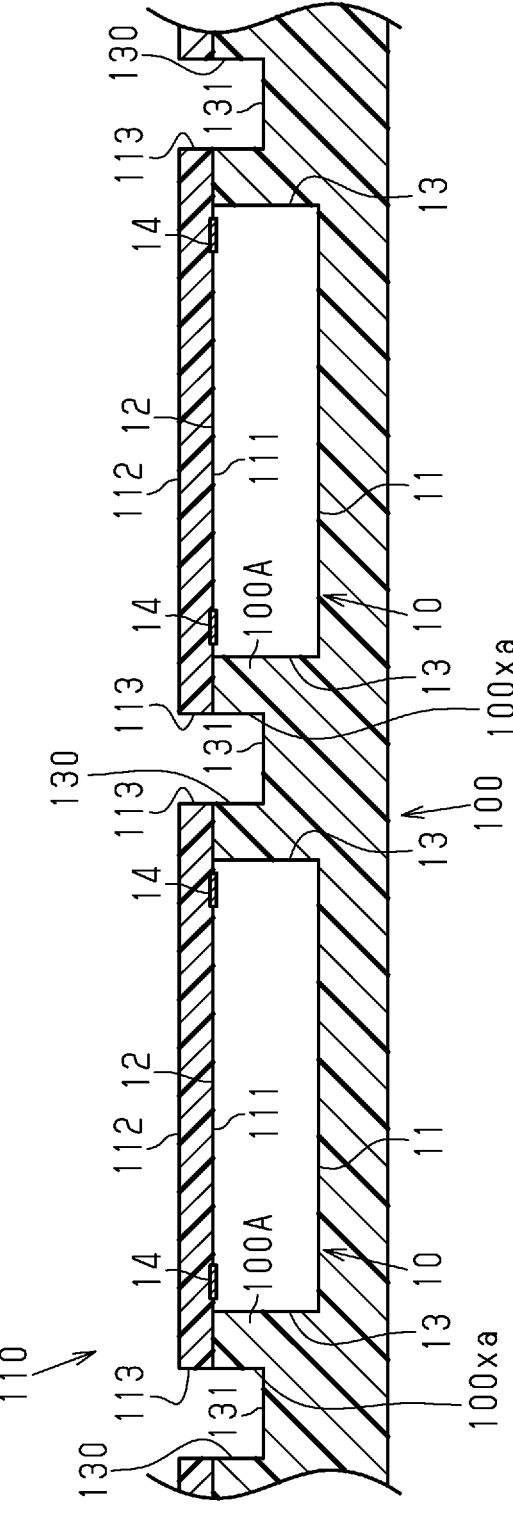
FIG. 8C is a diagram showing an example of a side surface forming step in the manufacturing method of the semiconductor device.
Figure 8C:
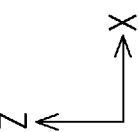

As shown in FIG. 8C, in the side surface forming step, separation slits 130 are formed in the insulation layer 110 and the encapsulation resin 100 at locations between adjacent ones of the semiconductor elements 10. Specifically, a portion of the insulation layer 110 located between adjacent ones of the semiconductor elements 10 is cut in the thickness-wise direction Z. Also, a portion of the encapsulation resin 100 located between adjacent ones of the semiconductor elements 10 is partially cut and removed in the thickness-wise direction Z. This forms the separation slits 130. The separation slits 130 are formed by dicing. The separation slits 130 are formed so that a bottom surface 131 of each separation slit 130 is located closer to the element back surface 12 than the element main surface 11 of the semiconductor element 10. The separation slits 130 form first resin portions 100A in the encapsulation resin 100, which are portions of the encapsulation resin 100 located toward the insulation layer 110 in the thickness-wise direction Z. The separation slits 130 also form first resin side surfaces 100xa of the first resin portions 100A in the encapsulation resin 100. The separation slits 130 also form side surfaces 113 in the insulation layer 110. The side surfaces 113 are formed between the main surface 111 and the back surface 112 in the thickness-wise direction Z.

Figure 8D:
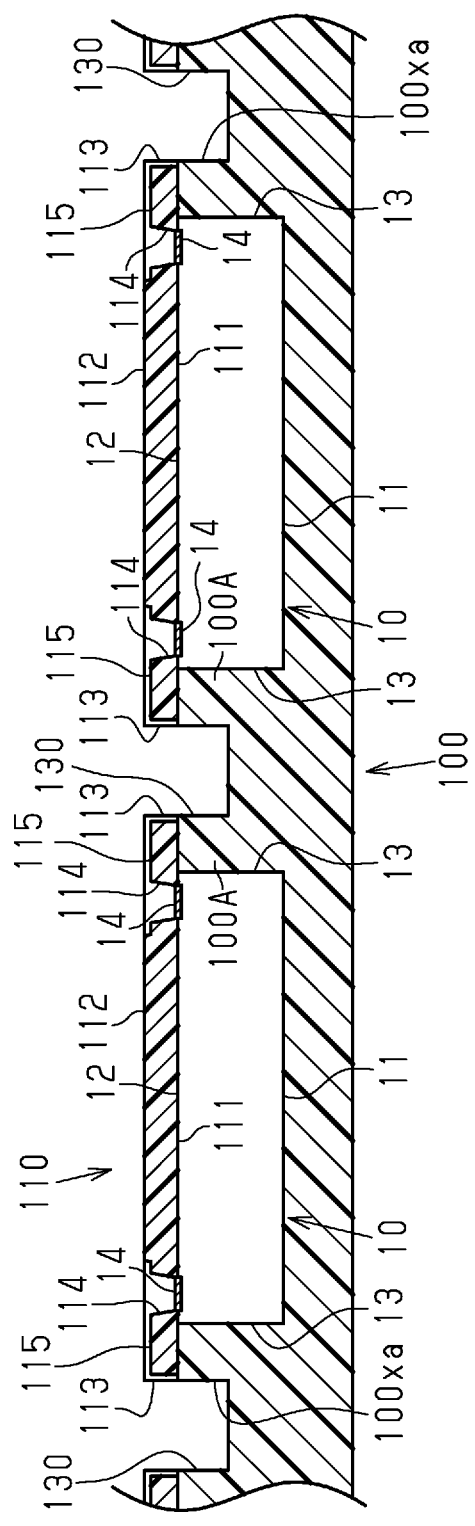
FIG. 8D is a diagram showing an example of a wire forming step in the manufacturing method of the semiconductor device.
Figure 8D:
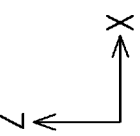
Figure 8E:
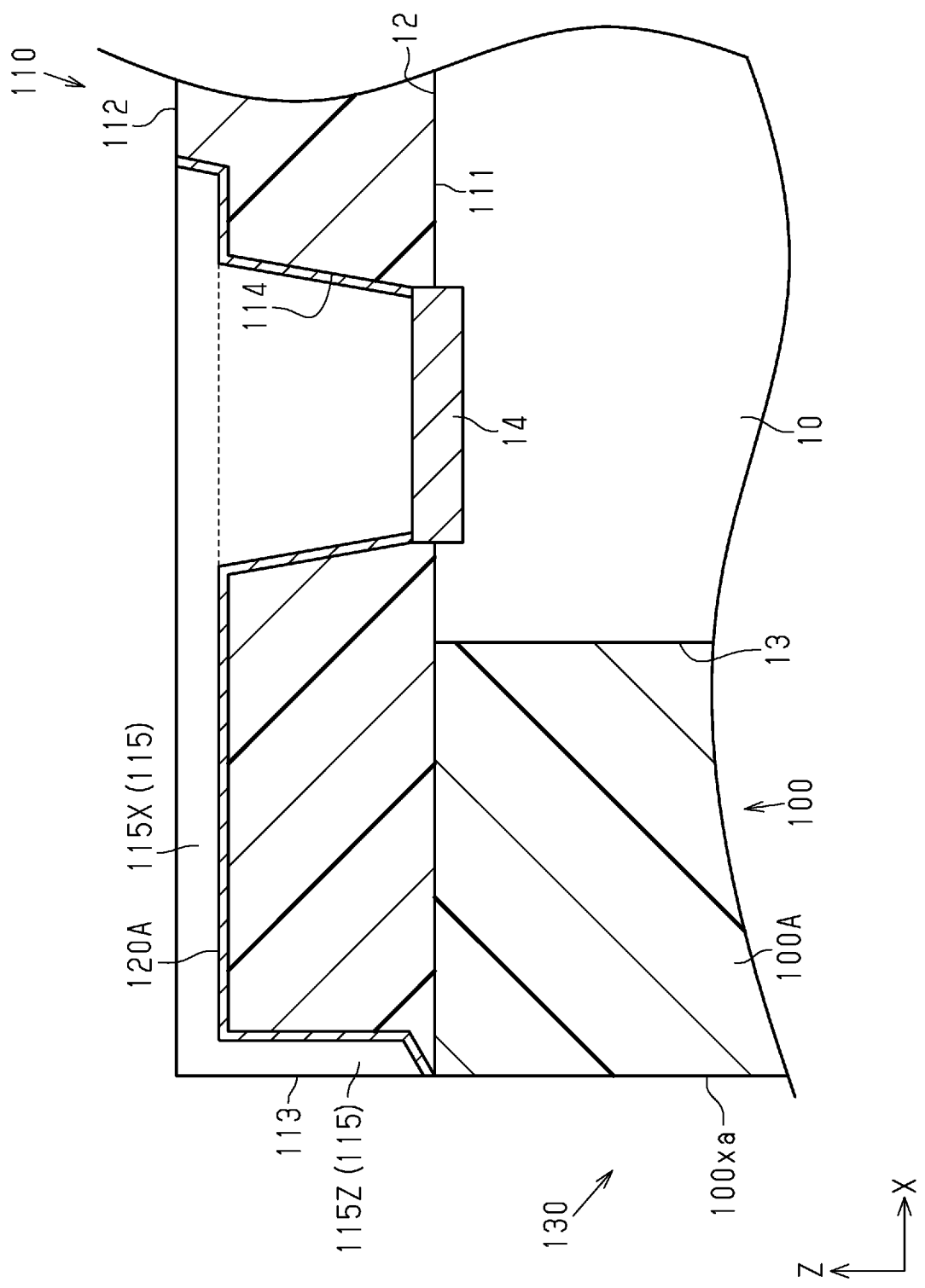
FIG. 8E is an enlarged view of FIG. 8D showing a portion of grooves and its surroundings.
Figure 8F:
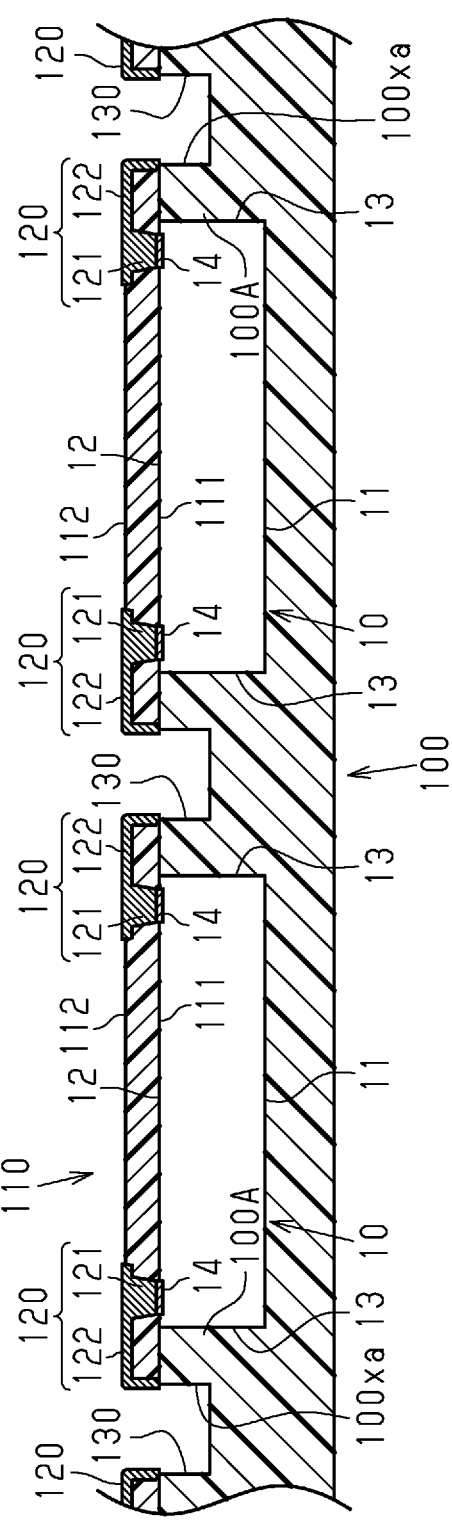
FIG. 8F is a diagram showing an example of a wire forming step in the manufacturing method of the semiconductor device.
Figure 8F:
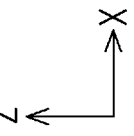

As shown in FIGS. 8D to 8G, in the wire forming step, the wires 120 (refer to FIGS. 8F and 8G) are formed to be joined to the electrodes 14 of the semiconductor element 10. The wires 120 correspond to the wires 40 of the semiconductor device 1. As shown in FIG. 8F, each wire 120 includes an embedded portion 121 and a redistribution portion 122. The embedded portions 121 are embedded in the insulation layer 110 and are joined to the electrodes 14 of the semiconductor element 10. Each of the embedded portions 121 and the redistribution portions 122 includes a base layer 120A and a plating layer 120B. As shown in FIG. 7, the wire forming step includes a base layer forming step (step S41) and a plating layer forming step (step S42). The base layer forming step and the plating layer forming step are sequentially executed to form the wires 120.

In the base layer forming step, as shown in FIG. 8E, the back surface 112 and the side surfaces 113 of the insulation layer 110 are processed to precipitate the base layer 120A. The side surfaces 113 of the insulation layer 110 are inner surfaces of the insulation layer 110 defining the separation slits 130. In this step, as shown in FIG. 8D, holes 114 and grooves 115 are formed in the insulation layer 110 by a laser. The holes 114 extend through the insulation layer 110 in the thickness-wise direction Z. The electrodes 14 of the semiconductor element 10 are exposed from the separate holes 114. The holes 114 are formed by irradiating the insulation layer 110 with a laser beam until the electrodes 14 are exposed as the positions of the electrodes 14 are recognized from images created by an infrared camera. Each position that is irradiated with a laser beam is corrected based on position information of the electrodes 14 obtained from the image recognition. As shown in FIG. 8E, each groove 115 includes a back groove 115X, which is recessed from the back surface 112 of the insulation layer 110 in the thickness-wise direction Z and is continuous with the hole 114, and a side groove 115Z, which is recessed from the side surface 113 of the insulation layer 110 in a direction orthogonal to the side surface 113 (in FIG. 8E, the width-wise direction X). The side groove 115Z is continuous with the back groove 115X. The grooves 115 are formed when the back surface 112 of the insulation layer 110 is irradiated with a laser beam. The laser beam is, for example, an ultraviolet beam having a wavelength of 355 nm and a diameter of 17 m. When the holes 114 and the grooves 115 are formed in the insulation layer 110, the base layer 120A is precipitated to cover the wall surfaces defining the holes 114 and the grooves 115. The base layer 120A is formed of a metallic element included in the additive of the insulation layer 110. The metallic element included in the additive is excited by the laser irradiation. As a result, a metal layer including the metallic element of the additive is precipitated as the base layer 120A.

Figure 8G:
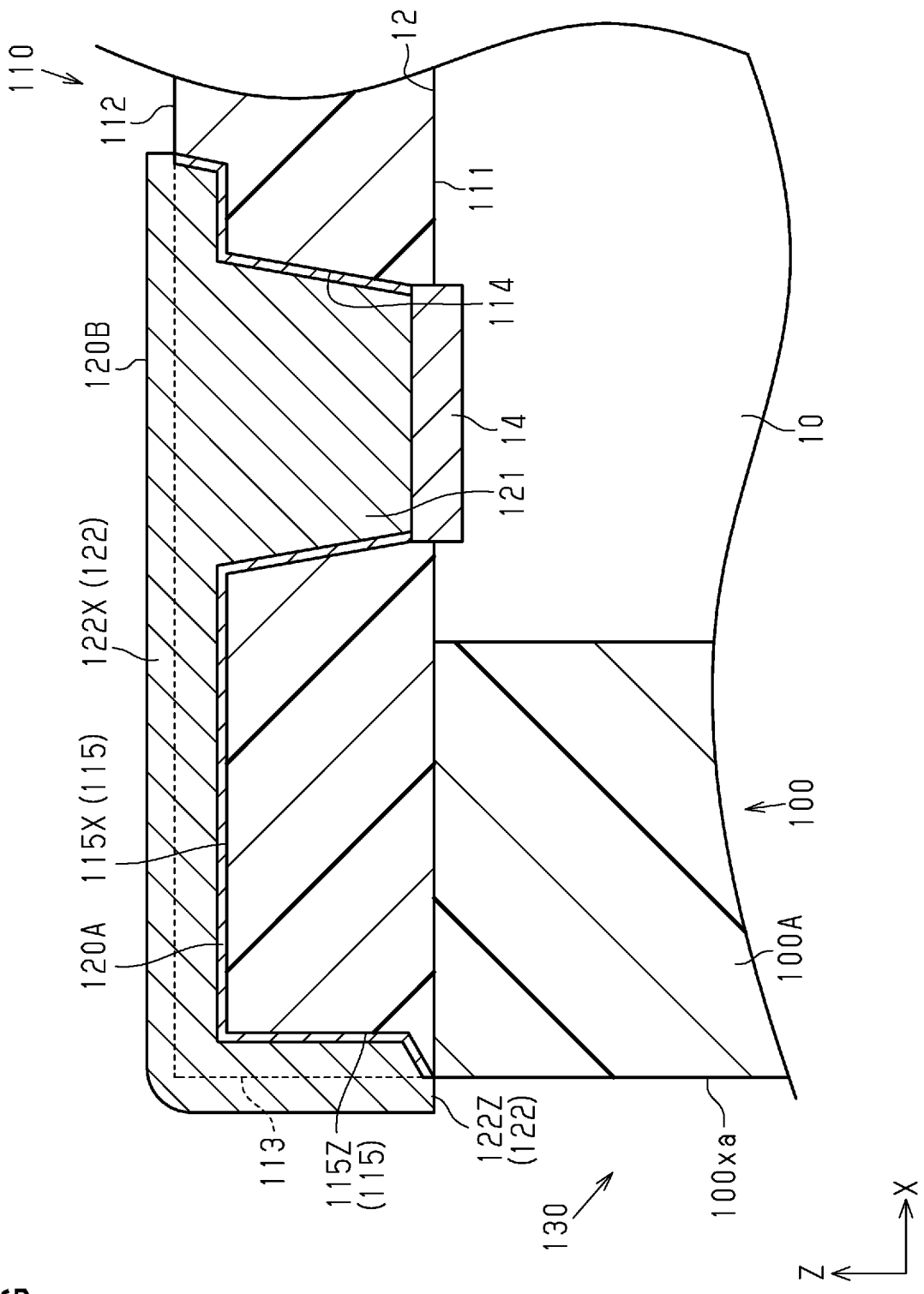
FIG. 8G is an enlarged view of FIG. 8F showing a portion of wires and its surroundings.

In the plating layer forming step, as shown in FIG. 8G, the plating layer 120B is formed to cover the base layer 120A. The plating layer 120B is formed from a material including copper. The plating layer 120B is formed through electroless plating. As a result, the embedded portion 121 is formed in each hole 114. Also, the redistribution portion 122 is formed in each groove 115. More specifically, a back redistribution portion 122X is formed in each back groove 115X, and a side redistribution portion 122Z is formed in each side groove 115Z. As a result, as shown in FIG. 8F, the wires 120 are formed.

Figure 8H:
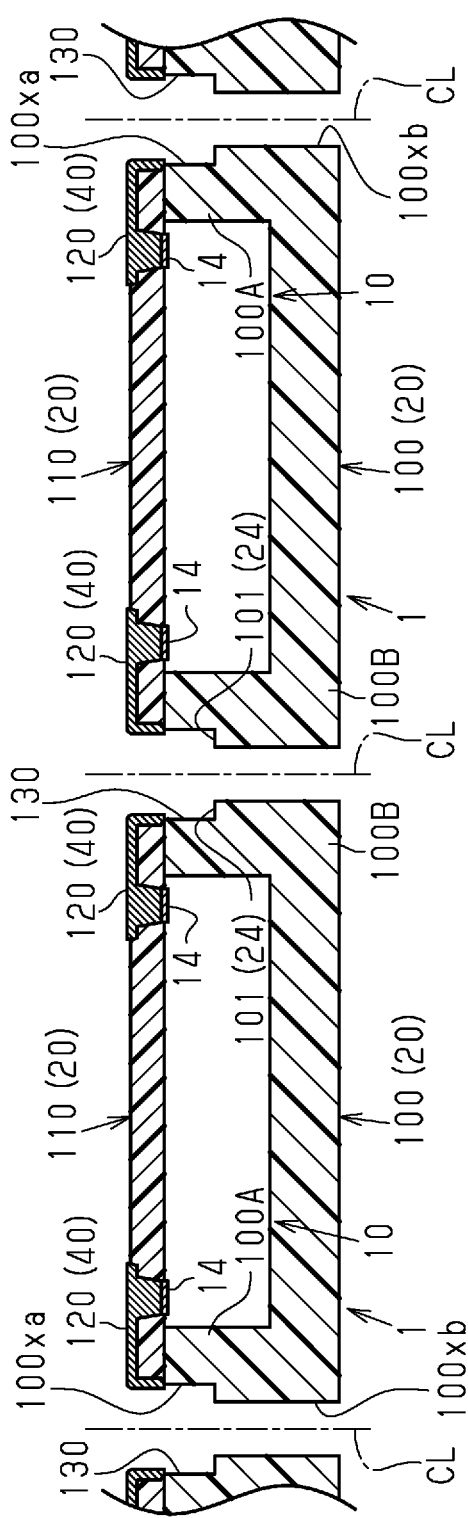
FIG. 8H is a diagram showing an example of a cutting step in the manufacturing method of the semiconductor device.
Figure 8H:
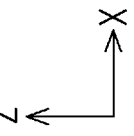
Figure 8I:
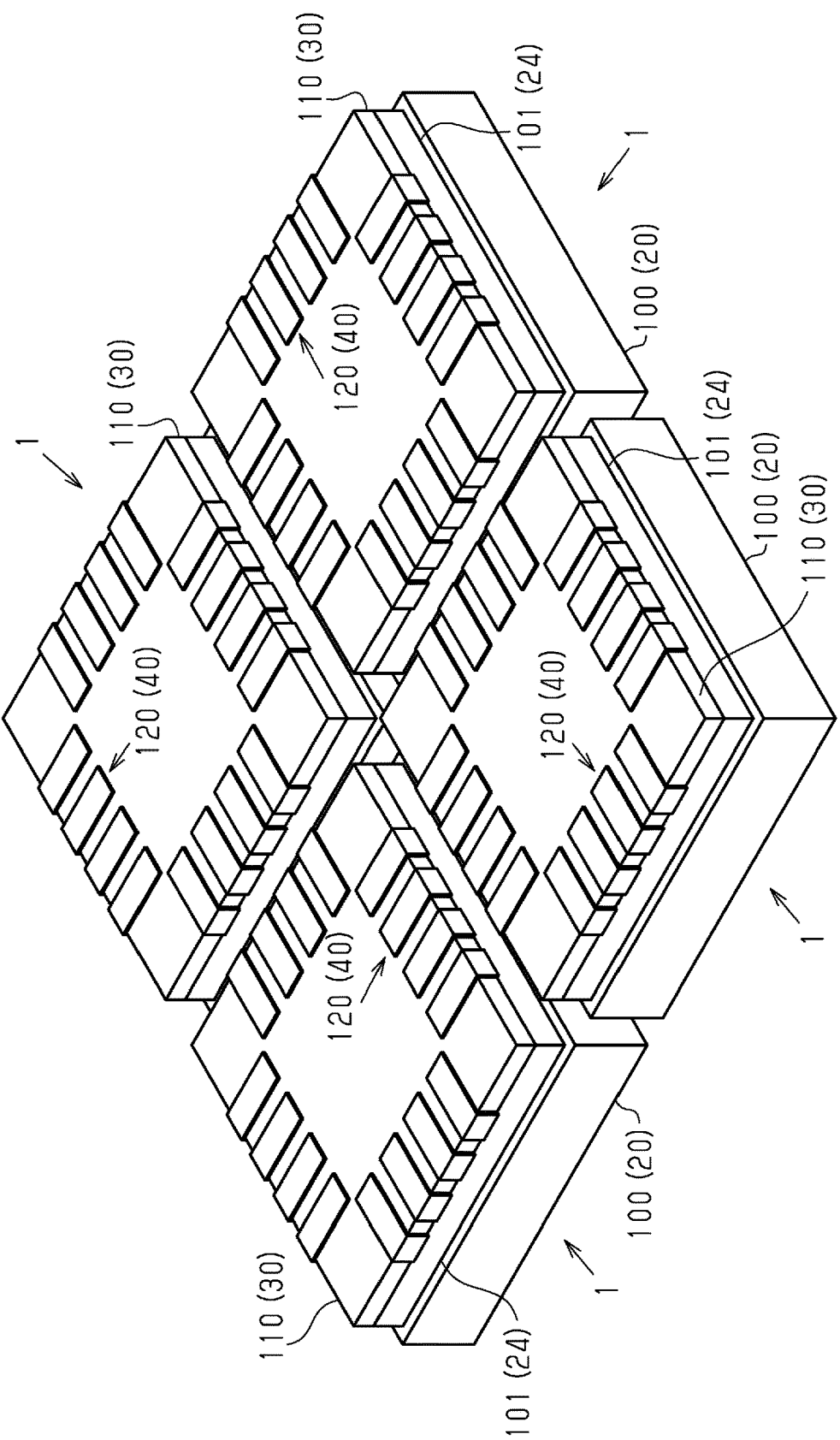
FIG. 8I is a diagram showing an example of a cutting step in the manufacturing method of the semiconductor device.

Finally, as shown in FIG. 8H, in the cutting step, the insulation layer 110 and the encapsulation resin 100 are cut, for example, with a dicing blade along cutting lines CL to separate into singulated pieces. As shown in FIG. 8I, the singulated pieces are arranged in a matrix. As shown in FIG. 8H, each cutting line CL is located in the separation slit 130 at a position outward from the wall surface defining the separation slit 130. When the encapsulation resin 100 is cut with the dicing blade, the encapsulation resin 100 includes a step 101, which is a recess in the first resin portion 100A, and a second resin portion 100B. The first resin portion 100A and the second resin portion 100B are located at opposite sides of the step 101 in the thickness-wise direction Z. In addition, when the encapsulation resin 100 is cut with the dicing blade, a second resin side surface 100xb of the second resin portion 100B is formed.

Each singulated piece includes one semiconductor element 10 and the wires 120 that are connected to the semiconductor element 10. The encapsulation resin 100 and the insulation layer 110 that are singulated in the cutting step correspond to the encapsulation resin 20 and the insulation layer 30 of the semiconductor device 1. The semiconductor device 1 is manufactured through the steps described above.

Operation

The operation of the present embodiment will now be described based on a comparison with a comparative example of a semiconductor device.

The semiconductor device of the comparative example includes a lead frame, a semiconductor element mounted on the lead frame, and an encapsulation resin encapsulating the semiconductor element and the lead frame. A plating process is performed on the surface of the lead frame to improve wettability. The semiconductor device of the comparative example is a surface-mount-type semiconductor device in which the lead frame is exposed in the back surface and side surfaces. In a method for manufacturing the semiconductor device of the comparative example, when semiconductor devices are connected by the base material forming the lead frame, the semiconductor devices are separated into singulated semiconductor devices using a dicing blade. Thus, in each semiconductor device, the plating layer is not formed on the portion of the lead frame exposed from a side surface of the encapsulation resin. When the semiconductor device of the comparative example is mounted on a wiring substrate with solder, the portion of the lead frame exposed from the side surface of the encapsulation resin has a low wettability and hampers formation of a solder fillet. As a result, after the semiconductor device of the comparative example is mounted on the wiring substrate, it is difficult to visually recognize the mount state of the semiconductor device of the comparative example.

Figure 9:
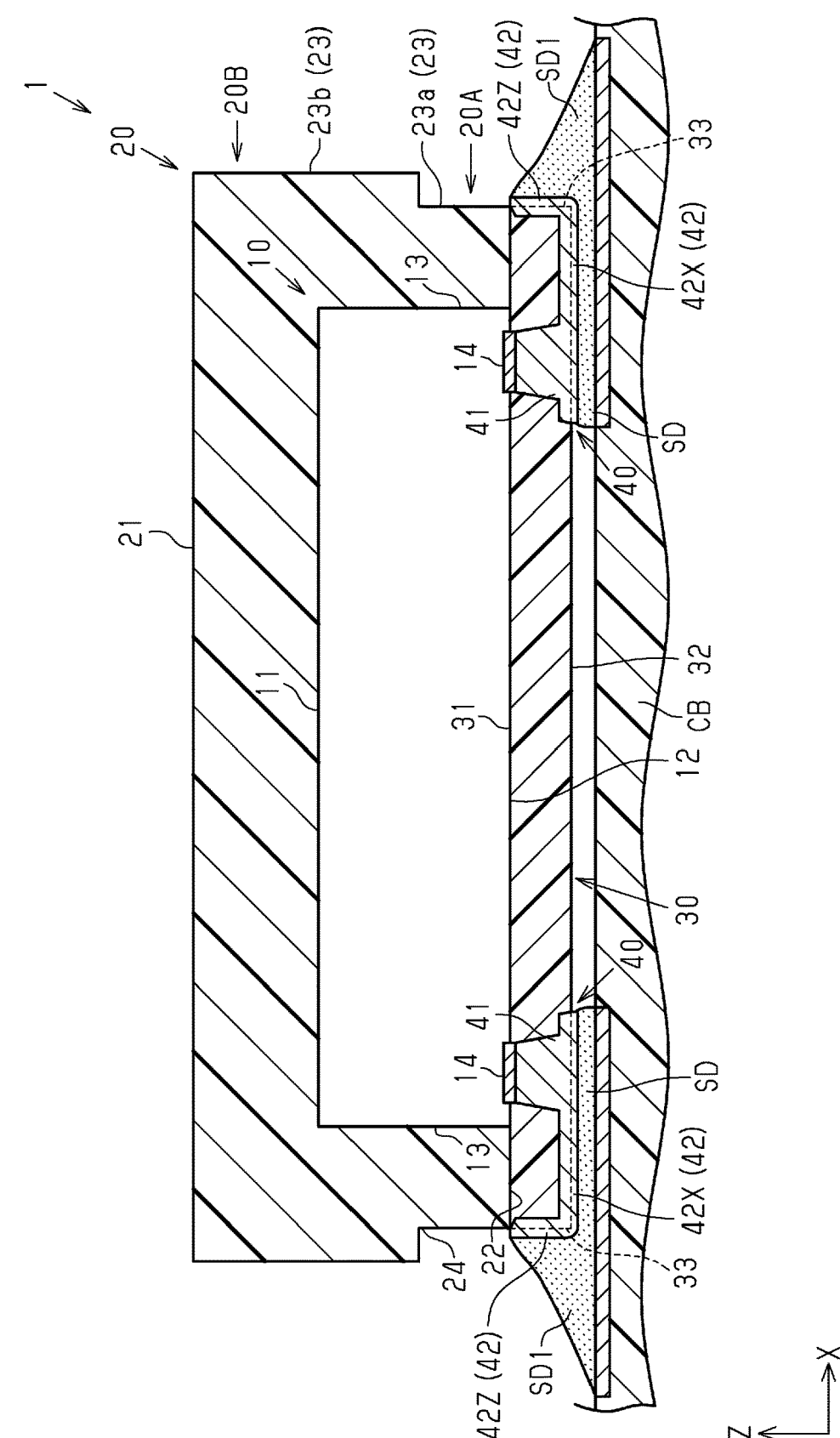
FIG. 9 is a schematic cross-sectional view of an embodiment of a semiconductor device mounted on a wiring substrate.

In this regard, in the present embodiment, the side redistribution portion 42Z, formed on the side surface 33 of the insulation layer 30, includes the plating layer 44. Thus, as shown in FIG. 9, when the semiconductor device 1 is mounted on a wiring substrate CB with solder SD, the solder SD readily comes into contact with the side redistribution portions 42Z and facilitates formation of solder fillets SD1. After the semiconductor device 1 is mounted on the wiring substrate CB, the mount state of the semiconductor device 1 is readily recognized based on the solder fillets SD1.

Advantages

The semiconductor device and the manufacturing method of the semiconductor device according to the present embodiment have the following advantages.

(1) The redistribution portion 42 is formed from the back surface 32 to the side surface 33 of the insulation layer 30. In this structure, when the semiconductor device 1 is mounted on the wiring substrate CB with the solder SD, the solder SD collects on the side redistribution portion 42Z, that is, the redistribution portion 42 formed on the side surface 33, to form the solder fillet SD1. Visual recognition of the mount state of the semiconductor device 1 is facilitated by the solder fillet SD1 exposed to the outside of the semiconductor device 1.

(2) The redistribution portion 42 is formed in the entirety of the side surface 33 of the insulation layer 30 in the thickness-wise direction Z. In this structure, when the semiconductor device 1 is mounted on the wiring substrate CB with the solder SD, the solder SD collects on the side redistribution portion 42Z. This increases the size of the solder fillet SD1, thereby further facilitating visual recognition of the solder fillet SD1.

(3) The side redistribution portion 42Z is disposed inward from the second resin side surface 23b of the second resin portion 20B. In this structure, in the cutting step, the side redistribution portion 42Z will not be cut by the dicing blade, and the plating layer formed on the side redistribution portion 42Z is maintained. Thus, when the semiconductor device 1 is mounted on the wiring substrate CB with the solder SD, the solder SD readily collects on the side redistribution portion 42Z. In addition, the side redistribution portion 42Z increases the area of the collection of the solder SD as compared to a semiconductor device that includes only the back redistribution portion 42X. Thus, when the semiconductor device 1 is mounted on the wiring substrate CB with the solder SD, the bonding strength between the semiconductor device 1 and the wiring substrate CB is improved.

(4) The semiconductor device 1 includes the insulation layer 30 including the back surface 32 and the wires 40, each of which includes the embedded portion 41 and the redistribution portion 42. The redistribution portion 42 of each wire 40 is disposed on the back surface 32 and is joined to the embedded portion 41 of the wire 40, which is joined to the electrode 14 of the semiconductor element 10. The insulation layer 30 includes the grooves 34, each of which includes the back groove 34X, which is recessed from the back surface 32 in the thickness-wise direction Z, and the side groove 34Z, which is recessed from the side surface 33 in a direction orthogonal to the side surface 33. The redistribution portions 42 of the wires 40 are in contact with the grooves 34. The grooves 34 correspond to the grooves 115 formed in the insulation layer 110 by a laser in the wire forming step in the manufacturing process of the semiconductor device 1.

The wire forming step includes the base layer forming step, in which the base layer 120A is precipitated on the surface of the insulation layer 110, and the plating layer forming step, in which the plating layer 120B is formed to cover the base layer 120A. The wires 120 correspond to the wires 40 of the semiconductor device 1. The insulation layer 110 is formed from a material including a thermosetting synthetic resin and an additive containing a metallic element that forms part (base layer 120A) of the wires 120. In the base layer forming step, the holes 114 and the grooves 115 are formed in the insulation layer 110 with a laser, thereby precipitating the base layer 120A covering the wall surfaces of the holes 114 and the grooves 115. The holes 114 are formed by exposing the electrodes 14 while recognizing an image of the positions of the electrodes 14 of the semiconductor element 10. In this structure, even when the encapsulation resin 100 is cured and shrunk to cause displacement of the semiconductor element 10, the position is corrected in correspondence with the displacement of the electrodes 14 based on image recognition for laser irradiation. Thus, the holes 114, which expose the electrodes 14, are accurately formed. That is, the wires 120 are formed in conformance with the positions of the electrodes 14. Thus, misalignment of the bonding portions between the electrodes 14 of the semiconductor element 10 and the wires 120 (wires 40) is limited.

(5) In the wire forming step in the manufacturing method of the semiconductor device 1, the plating layer 120B is formed through electroless plating. This configuration eliminates the need for precipitating the base layer 120A, which is used as a conductive path to form plating, thereby further increasing the efficiency for forming the wires 120 as compared to a configuration in which the plating layer 120B is formed through electrolytic plating.

(6) The back redistribution portion 42X of the redistribution portion 42 projects beyond the back surface 32 of the insulation layer 30 in the thickness-wise direction Z. In this structure, when the semiconductor device 1 is mounted on the wiring substrate CB, the semiconductor device 1 is further readily mounted.

Modified Examples

The embodiment exemplifies, without any intention to limit, applicable forms of a semiconductor device and a method for manufacturing a semiconductor device according to the present disclosure. The semiconductor device and the method for manufacturing a semiconductor device according to the present disclosure may be applicable to forms differing from the embodiment. In an example of such a form, the structure of the embodiment is partially replaced, changed, or omitted, or a further structure is added to the above embodiment. In the following modified examples, the same reference characters are given to those elements that are the same as the corresponding elements of the embodiment. Such elements will not be described in detail.

Figure 10:
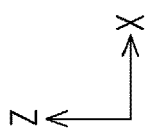
FIG. 10 is a schematic cross-sectional view showing a modified example of a semiconductor device.

In the embodiment, the shape of the insulation layer 30 may be changed in any manner. In an example, as shown in a semiconductor device 1A in FIG. 10, the insulation layer 30 may enter the step 24 of the encapsulation resin 20. The insulation layer 30 includes a first cover 35 and a second cover 36. The first cover 35 covers the resin back surface 22 of the encapsulation resin 20 and the element back surface 12 of the semiconductor element 10. The second cover 36 covers the side surfaces 33 of the insulation layer 30 and the first resin side surfaces 23a of the first resin portion 20A. The second cover 36 covers the entirety of the first resin side surfaces 23a. In FIG. 10, the thickness TC2 of the second cover 36 is less than the thickness TC1 of the first cover 35. The thickness TC1 of the first cover 35 corresponds to the thickness TL of the insulation layer 30 in the embodiment.

Figure 11:
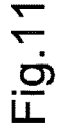
FIG. 11 is an enlarged view of FIG. 10 showing a portion of wires and its surroundings.
Figure 11:
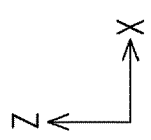

As shown in FIG. 11, the back groove 34X is formed in the first cover 35, and the side groove 34Z is formed in the second cover 36. The side groove 34Z is formed in the entirety of the second cover 36 in the thickness-wise direction Z. The redistribution portion 42 of each wire 40 is formed in the first cover 35 and the second cover 36. The redistribution portion 42 is formed in the entirety of the second cover 36 (the side groove 34Z) in the thickness-wise direction Z.

A method for manufacturing the semiconductor device 1A shown in FIG. 10 will now be described with reference to FIGS. 12A to 12E. The method for manufacturing the semiconductor device 1A shown in FIG. 10 includes the element embedding step, the insulation layer forming step, the side surface forming step, the wire forming step, and the cutting step as in the method for manufacturing the semiconductor device 1 of the embodiment.

Figure 12A:
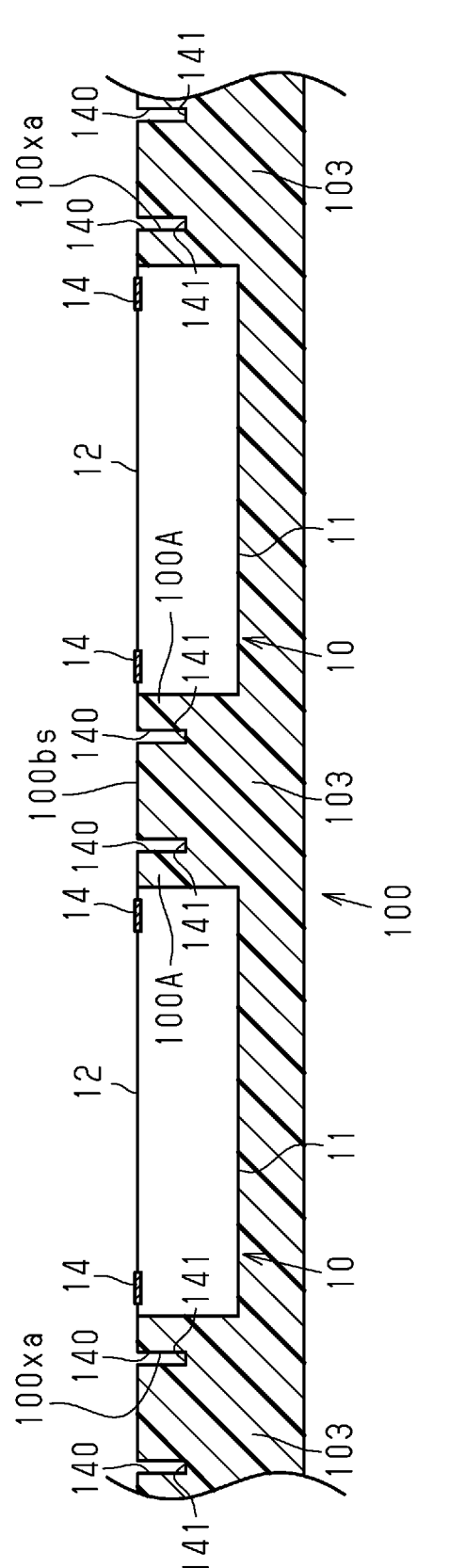
FIG. 12A is a diagram showing an example of an element embedding step in a modified example of a method for manufacturing the semiconductor device in the modified example shown in FIG. 10.
Figure 12A:
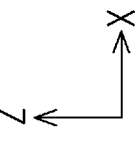

As shown in FIG. 12A, in the element embedding step, semiconductor elements 10 are embedded in the encapsulation resin 100. Grooves 140 are formed in each joint portion 103 of the encapsulation resin 100 located between adjacent ones of the semiconductor elements 10. Two grooves 140 are separate from each other and are formed in the joint portion 103. The grooves 140 are formed from the resin back surface 100bs of the encapsulation resin 100 in the thickness-wise direction Z. In this step, the material of the encapsulation resin 100 and the semiconductor elements 10 are disposed in a mold and then undergo compression molding. A material including a black epoxy resin is used as the material of the encapsulation resin 100. In this step, each semiconductor element 10 is embedded in the encapsulation resin 100 so that part of the semiconductor element 10 located toward the element main surface 11 is embedded in the encapsulation resin 100 and that the element back surface 12 and the electrodes 14 formed on the element back surface 12 are exposed from the resin back surface 100*bs* of the encapsulation resin 100. The grooves 140 may be formed, for example, at the same time as the step of embedding the semiconductor elements 10 in the encapsulation resin 100 by a mold for compression molding. Alternatively, the grooves 140 may be formed by dicing after the semiconductor elements 10 are embedded in the encapsulation resin 100 through compression molding. The grooves 140 are formed so that a bottom surface 141 of each groove 140 is located closer to the element back surface 12 than the element main surface 11 of the semiconductor element 10. The grooves 140 form the first resin portions 100A in the encapsulation resin 100, which are portions of the encapsulation resin 100 located toward the insulation layer 110 in the thickness-wise direction Z. The grooves 140 also form the first resin side surfaces 100*xa* of the first resin portions 100A in the encapsulation resin 100.

Figure 12B:
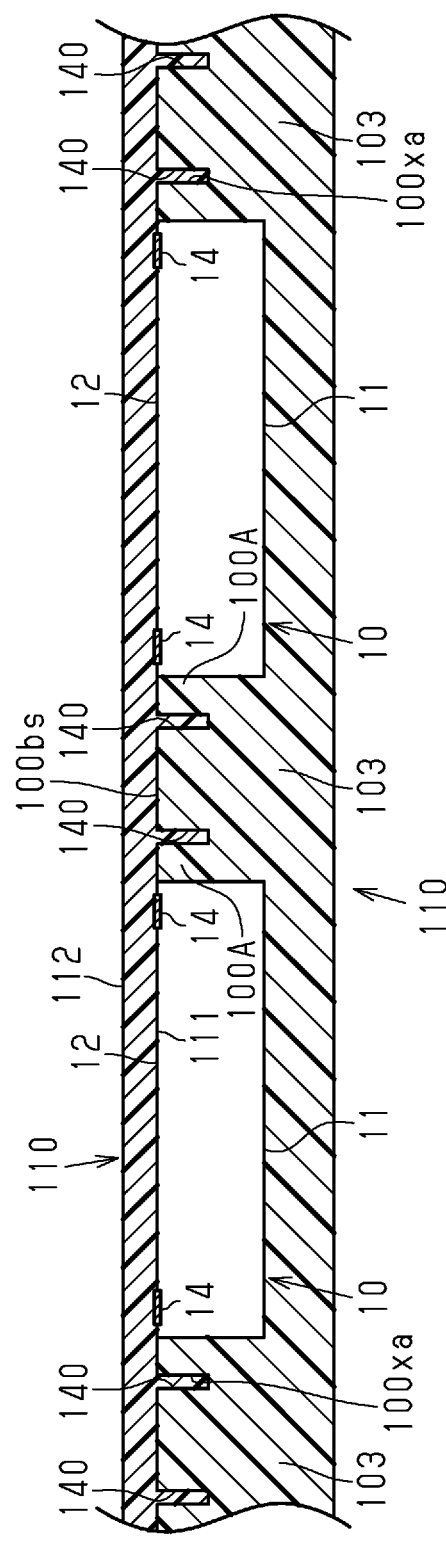
FIG. 12B is a diagram showing an example of an insulation layer forming step in the manufacturing method of the semiconductor device in the modified example shown in FIG. 10.

As shown in FIG. 12B, in the insulation layer forming step, an insulation layer 110 is stacked on the resin back surface 100*bs* of the encapsulation resin 100 and covers the element back surface 12 and the electrodes 14 of each semiconductor element 10. A portion of the insulation layer 110 enters the groove 140. Thus, the first resin side surface 100*xa* of the first resin portion 100A is covered by a portion of the insulation layer 110. The insulation layer 110 is formed from a material including a thermosetting synthetic resin and an additive containing a metallic element that forms part of wires 120, which will be described later. The synthetic resin of the insulation layer 110 is, for example, an epoxy resin or a polyimide resin. The insulation layer 110 is formed through compression molding.

Figure 12C:
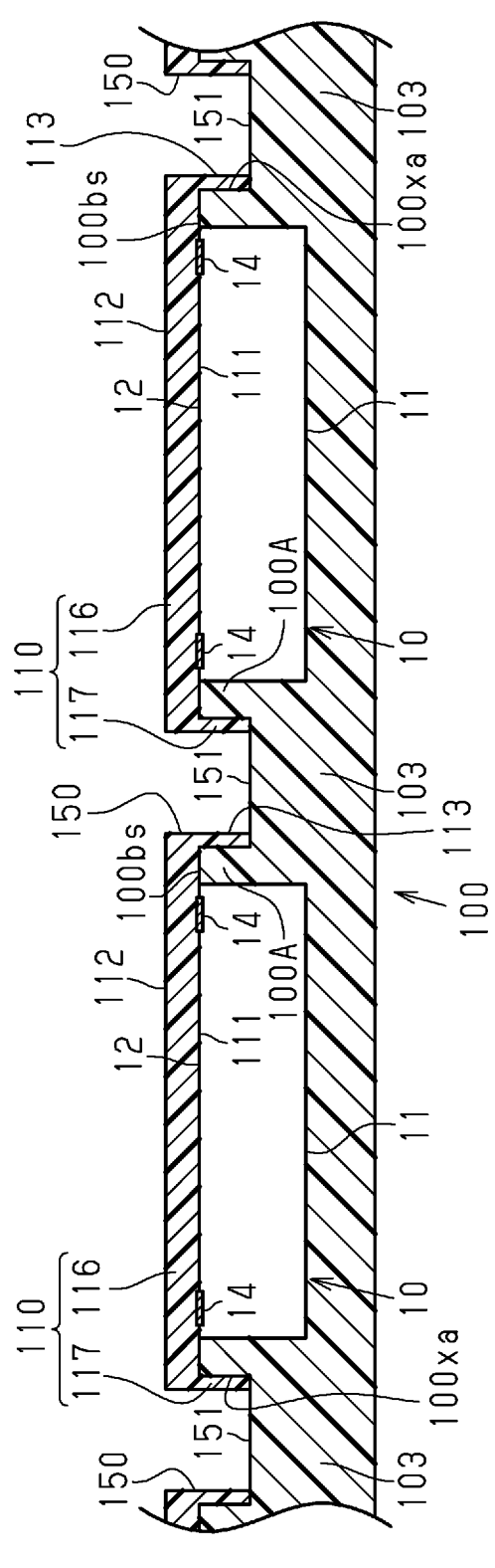
FIG. 12C is a diagram showing an example of a side surface forming step in the manufacturing method of the semiconductor device in the modified example shown in FIG. 10.
Figure 12C:
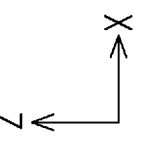

As shown in FIG. 12C, in the side surface forming step, separation slits 150 are formed in the insulation layer 110 and the encapsulation resin 100 at locations between adjacent ones of the semiconductor elements 10. The separation slits 150 are formed by dicing. Each separation slit 150 is formed so that the two grooves 140 (refer to FIG. 12A) formed in the joint portion 103 are continuous with each other. The separation slit 150 is formed so that a bottom surface 151 of the separation slit 150 is flush with the bottom surface 141 (refer to FIG. 12A) of the grooves 140. In accordance with formation of the separation slit 150, the insulation layer 110 may be partially removed from the grooves 140. As a result, the insulation layer 110 includes a first cover 116 and a second cover 117. The first cover 116 covers the resin back surface 100*bs* of the encapsulation resin 100 and the element back surface 12 and the electrodes 14 of the semiconductor element 10. The second cover 117 covers the first resin side surface 100*xa* of the encapsulation resin 100. The separation slits 150 also form the side surfaces 113 in the insulation layer 110. The side surfaces 113 are side surfaces of the second cover 117. The side surfaces 113 are formed in the entirety of the first resin side surfaces 100*xa* of the encapsulation resin 100 in the thickness-wise direction Z.

Figure 12D:
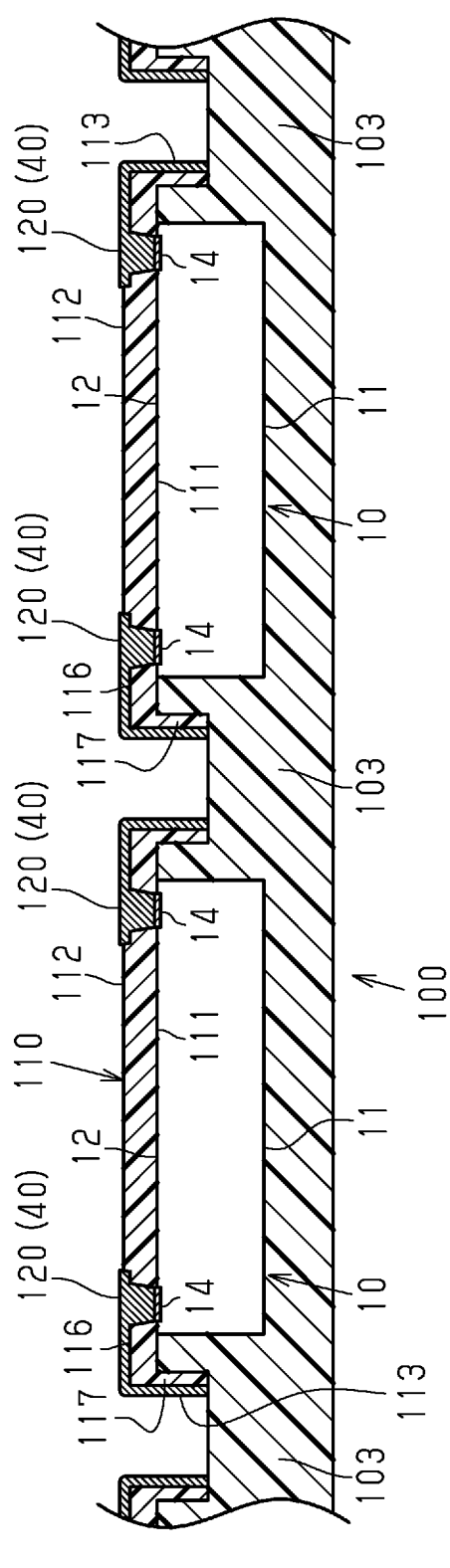
FIG. 12D is a diagram showing an example of a wire forming step in the manufacturing method of the semiconductor device in the modified example shown in FIG. 10.
Figure 12D:
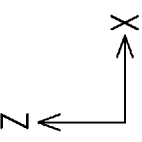

As shown in FIG. 12D, in the wire forming step, the wires 120 are formed in the same manner as the embodiment. In FIG. 12D, each wire 120 is formed in the first cover 116 and the second cover 117. The wire 120 is formed on the entirety of the second cover 117 in the thickness-wise direction Z. The wires 120 correspond to the wires 40 of the semiconductor device 1A in the modified example.

Figure 12E:
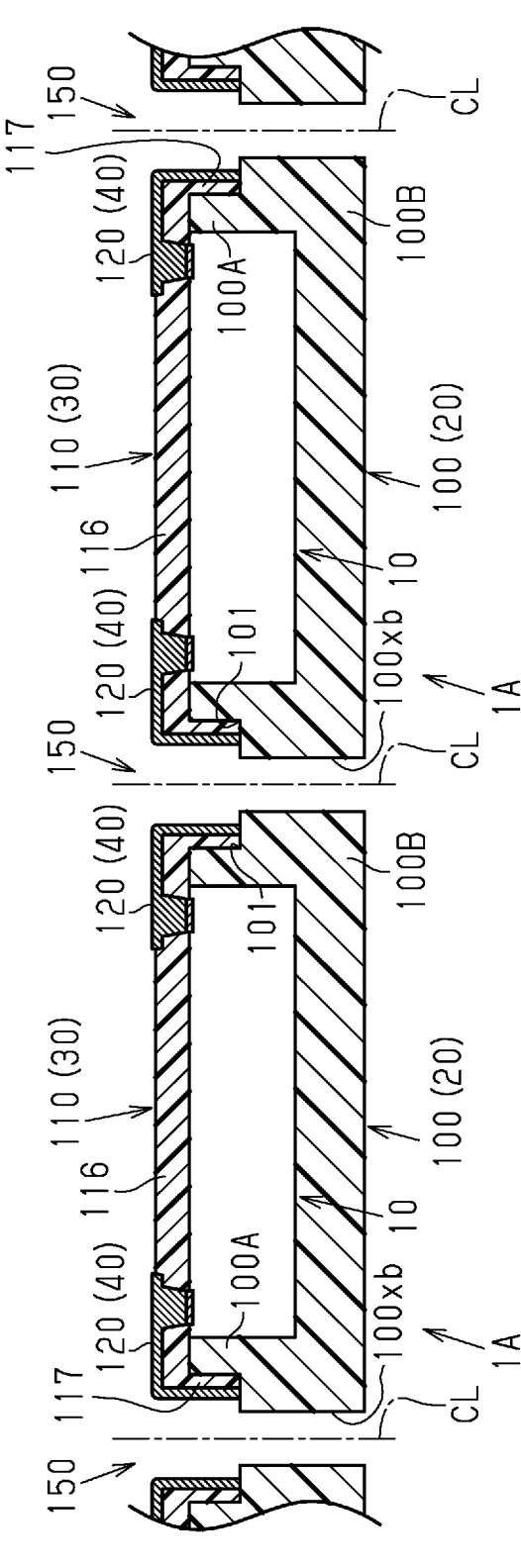
FIG. 12E is a diagram showing an example of a cutting step in the manufacturing method of the semiconductor device in the modified example shown in FIG. 10.
Figure 12E:
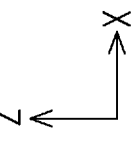

Then, as shown in FIG. 12E, in the cutting step, the insulation layer 110 and the encapsulation resin 100 are cut, for example, with a dicing blade along cutting lines CL to separate into singulated pieces in the same manner as the above embodiment. In this case, as shown in FIG. 12E, the cutting line CL is located in the separation slit 150 at a position outward from the wall surface defining the separation slit 150. Specifically, the position of the dicing blade and the thickness of the dicing blade are set so that the dicing blade will not contact the wire 120 formed in the second cover 117. When the encapsulation resin 100 is cut with the dicing blade, the encapsulation resin 100 includes a step 101, which is a recess in the first resin portion 100A, and a second resin portion 100B. The first resin portion 100A and the second resin portion 100B are located at opposite sides of the step 101 in the thickness-wise direction Z. In addition, when the encapsulation resin 100 is cut with the dicing blade, a second resin side surface 100*xb* of the second resin portion 100B is formed.

Each singulated piece includes one semiconductor element 10 and the wires 120 that are connected to the semiconductor element 10. The encapsulation resin 100 and the insulation layer 110 that are singulated in the cutting step correspond to the encapsulation resin 20 and the insulation layer 30 of the semiconductor device 1A. The semiconductor device 1A is manufactured through the steps described above.

With this structure, the dimension of the side redistribution portion 42Z in the thickness-wise direction Z is greater than the thickness of the insulation layer 30. Thus, when the semiconductor device 1A is mounted on the wiring substrate CB with the solder SD (refer to FIG. 9), the solder is bonded to the side redistribution portion 42Z, so that the size of the solder fillet SD1 is increased (refer to FIG. 9). This facilitates exposure of the solder fillet SD1 from the step 24 of the encapsulation resin 20, thereby allowing for easy recognition of the mount state of the semiconductor device 1A on the wiring substrate CB. In addition, the side redistribution portion 42Z increases the area of the collection of the solder SD as compared to a semiconductor device that includes only the back redistribution portion 42X. Thus, when the semiconductor device 1A is mounted on the wiring substrate CB with the solder SD, the bonding strength between the semiconductor device 1A and the wiring substrate CB is improved. In addition, when the grooves 140 are formed using a dicing blade in the element embedding step, the same dicing blade may be used to form the grooves 140 and to perform the cutting step.

The method for manufacturing the semiconductor device 1A shown in FIG. 10 is not limited to the above-described manufacturing method shown in FIGS. 12A to 12E. For example, the method for manufacturing the semiconductor device 1A shown in FIG. 10 may be performed in the order of the steps shown in FIGS. 13A to 13E. In this case, the method for manufacturing the semiconductor device 1A shown in FIG. 10 also includes the element embedding step, the insulation layer forming step, the side surface forming step, the wire forming step, and the cutting step as in the above-described manufacturing method.

Figure 13A:
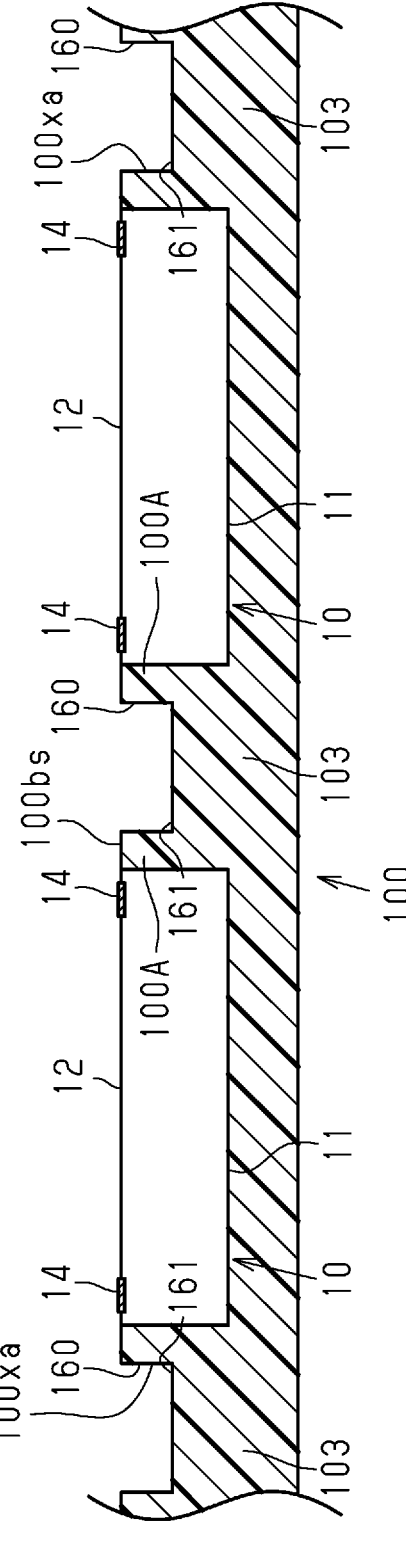
FIG. 13A is a diagram showing an example of an element embedding step in a further manufacturing method of the semiconductor device in the modified example shown in FIG. 10.
Figure 13A:
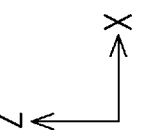

As shown in FIG. 13A, in the element embedding step, semiconductor elements 10 are embedded in the encapsulation resin 100. Grooves 160 are formed in each joint portion 103 of the encapsulation resin 100 located between adjacent ones of the semiconductor elements 10. The grooves 160 are formed from the resin back surface 100*bs* of the encapsulation resin 100 in the thickness-wise direction Z. The width of each groove 160 in the width-wise direction X is greater than the width of each of the two grooves 140 (refer to FIG. 12A) in the width-wise direction X. The width of the groove 160 shown in FIG. 13A in the width-wise direction X is, for example, equal to the distance in the width-wise direction X between adjacent ones of the grooves 140 shown in FIG. 12A in the width-wise direction X. The grooves 160 are formed so that a bottom surface 161 of each groove 160 is located closer to the element back surface 12 than the element main surface 11 of the semiconductor element 10. The grooves 160 form the first resin portions 100A in the encapsulation resin 100, which are portions of the encapsulation resin 100 located toward the insulation layer 110 in the thickness-wise direction Z. The grooves 160 also form the first resin side surfaces 100xa of the first resin portions 100A in the encapsulation resin 100.

In the element embedding step, the material of the encapsulation resin 100 and the semiconductor elements 10 are disposed in a mold and then undergo compression molding. A material including a black epoxy resin is used as the material of the encapsulation resin 100. In this step, each semiconductor element 10 is embedded in the encapsulation resin 100 so that part of the semiconductor element 10 located toward the element main surface 11 is embedded in the encapsulation resin 100 and that the element back surface 12 and the electrodes 14 formed on the element back surface 12 are exposed from the resin back surface 100bs of the encapsulation resin 100. The grooves 160 may be formed, for example, at the same time as the step of embedding the semiconductor elements 10 in the encapsulation resin 100 by a compression molding mold. Alternatively, the grooves 160 may be formed by dicing after the semiconductor elements 10 are embedded in the encapsulation resin 100 through compression molding.

Figure 13B:
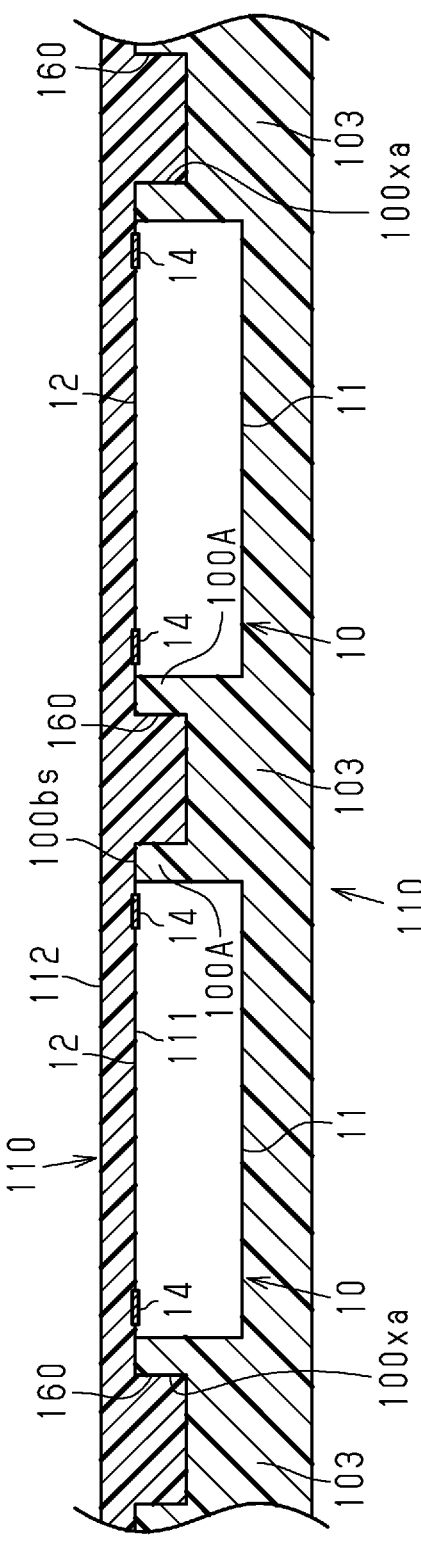
FIG. 13B is a diagram showing an example of an insulation layer forming step in the further manufacturing method of the semiconductor device in the modified example shown in FIG. 10.
Figure 13B:
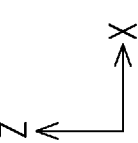

As shown in FIG. 13B, in the insulation layer forming step, an insulation layer 110 is stacked on the resin back surface 100bs of the encapsulation resin 100 and covers the element back surface 12 and the electrodes 14 of each semiconductor element 10. A portion of the insulation layer 110 enters the groove 160. Thus, the first resin side surface 100xa of the first resin portion 100A is covered by a portion of the insulation layer 110. The insulation layer 110 is formed from a material including a thermosetting synthetic resin and an additive containing a metallic element that forms part of wires 120, which will be described later. The synthetic resin of the insulation layer 110 is, for example, an epoxy resin or a polyimide resin. The insulation layer 110 is formed through compression molding.

Figure 13C:
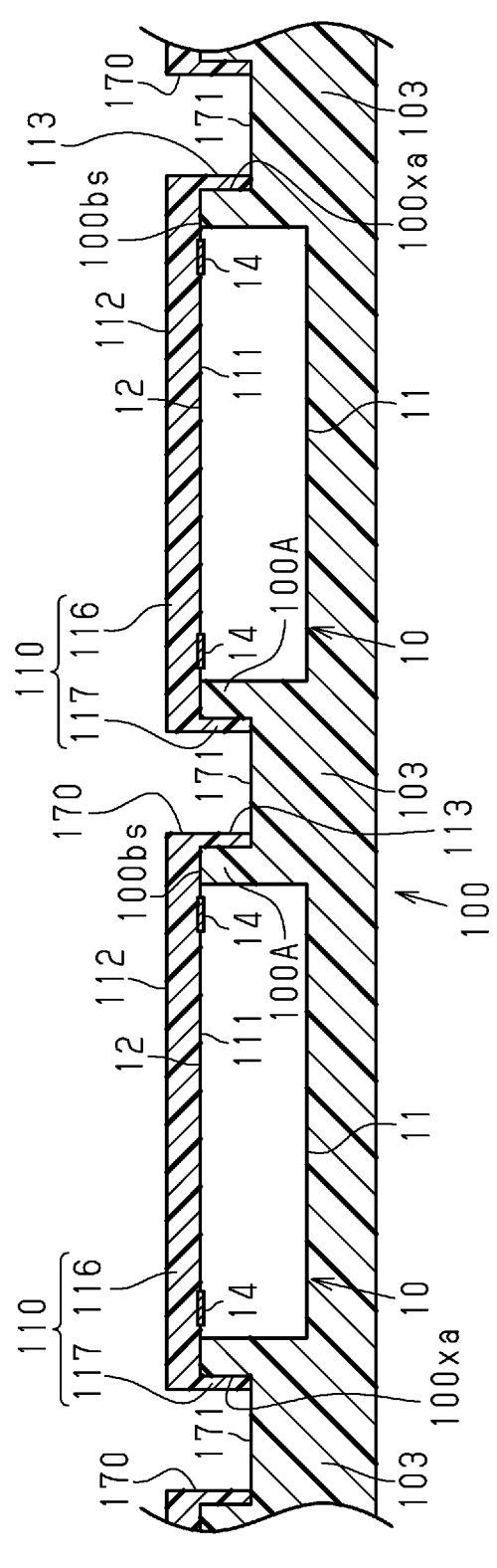
FIG. 13C is a diagram showing an example of a side surface forming step in the further manufacturing method of the semiconductor device in the modified example shown in FIG. 10.

As shown in FIG. 13C, in the side surface forming step, separation slits 170 are formed in the insulation layer 110 and the encapsulation resin 100 at locations between adjacent ones of the semiconductor elements 10. The separation slits 170 are formed by dicing. The separation slits 170 are formed by dicing the insulation layer 110 received in the grooves 160 (refer to FIG. 13A) formed in the joint portions 103. The dicing blade used to form the separation slits 170 has a smaller thickness in the width-wise direction X than the dicing blade used to form the grooves 160. Thus, the separation slits 170 have a smaller width in the width-wise direction X than the grooves 160. In addition, the separation slits 170 are formed so that a bottom surface 171 of each groove 160 is flush with the bottom surface 161 (refer to FIG. 13A). As a result, the insulation layer 110 includes a first cover 116 and a second cover 117. The first cover 116 covers the resin back surface 100bs of the encapsulation resin 100 and the element back surface 12 and the electrodes 14 of the semiconductor element 10. The second cover 117 covers the first resin side surface 100xa of the encapsulation resin 100. The separation slits 170 also form the side surfaces 113 in the insulation layer 110. The side surfaces 113 are side surfaces of the second cover 117. The side surfaces 113 are formed in the entirety of the first resin side surfaces 100xa of the encapsulation resin 100 in the thickness-wise direction Z. The separation slit 170 is equal to the separation slit 150 (refer to FIG. 12C) in the width in the width-wise direction X and the depth in the thickness-wise direction Z.

Figure 13D:
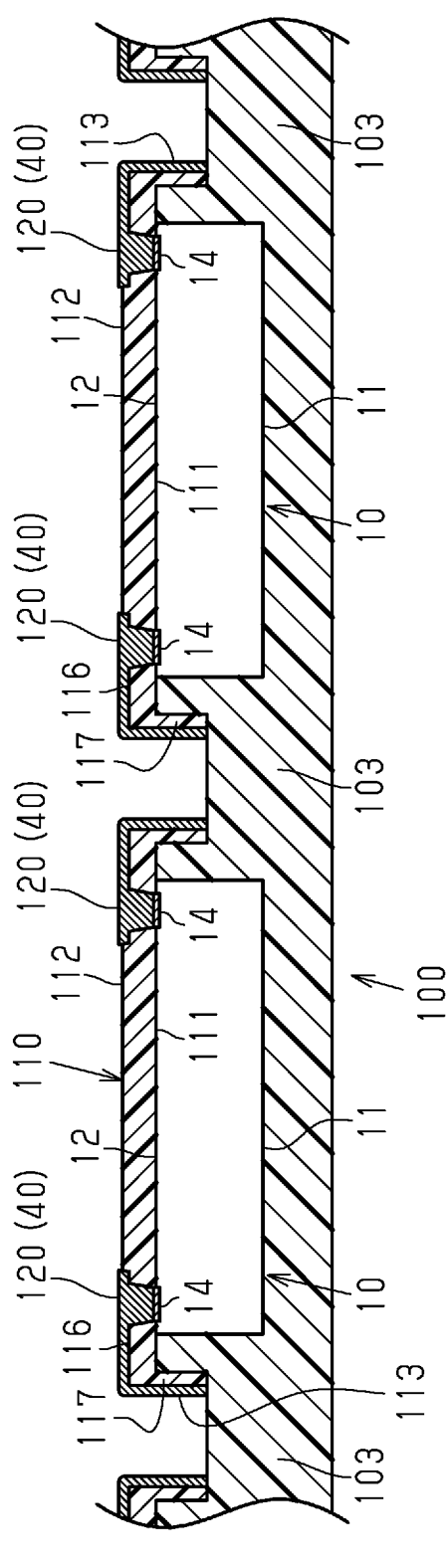
FIG. 13D is a diagram showing an example of a wire forming step in the further manufacturing method of the semiconductor device in the modified example shown in FIG. 10.
Figure 13D:
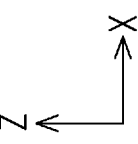

As shown in FIG. 13D, in the wire forming step, the wires 120 are formed in the same manner as the wire forming step shown in FIG. 12D. In FIG. 13D, each wire 120 is formed in the first cover 116 and the second cover 117. The wire 120 is formed on the entirety of the second cover 117 in the thickness-wise direction Z. The wires 120 correspond to the wires 40 of the semiconductor device 1A in the modified example.

Figure 13E:
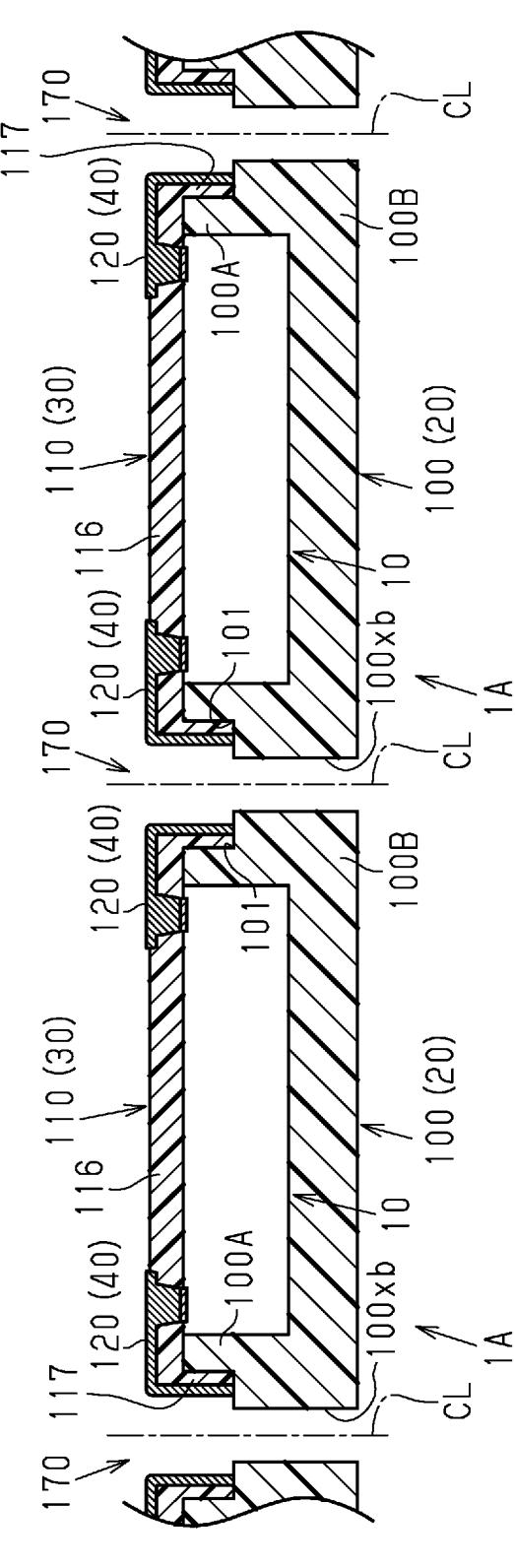
FIG. 13E is a diagram showing an example of a cutting step in the further manufacturing method of the semiconductor device in the modified example shown in FIG. 10.
Figure 13E:
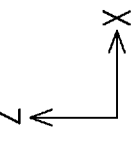

As shown in FIG. 13E, in the cutting step, the insulation layer 110 and the encapsulation resin 100 are cut, for example, with a dicing blade along the cutting lines CL to separate into singulated pieces in the same manner as the wire forming step shown in FIG. 12E. In this case, as shown in FIG. 13E, the cutting line CL is located in the separation slit 170 at a position outward from the wall surface defining the separation slit 170. Specifically, the position of the dicing blade and the thickness of the dicing blade in the width-wise direction X are set so that the dicing blade will not contact the wire 120 formed in the second cover 117. That is, the dicing blade used to cut the encapsulation resin 100 has a smaller thickness in the width-wise direction X than the dicing blade used to form the separation slit 170. When the encapsulation resin 100 is cut with the dicing blade, the encapsulation resin 100 includes a step 101, which is a recess in the first resin portion 100A, and a second resin portion 100B. The first resin portion 100A and the second resin portion 100B are located at opposite sides of the step 101 in the thickness-wise direction Z. In addition, when the encapsulation resin 100 is cut with the dicing blade, a second resin side surface 100xb of the second resin portion 100B is formed.

Each singulated piece includes one semiconductor element 10 and the wires 120 that are connected to the semiconductor element 10. The encapsulation resin 100 and the insulation layer 110 that are singulated in the cutting step correspond to the encapsulation resin 20 and the insulation layer 30 of the semiconductor device 1A. The semiconductor device 1A is manufactured through the steps described above.

With this structure, the same advantages as those of the method for manufacturing the semiconductor device 1A shown in FIGS. 12A to 12E are obtained. In the method for manufacturing the semiconductor device 1A shown in FIGS. 12A to 12E, in the element embedding step, the grooves 140 in each joint portion 103 are formed using a dicing blade, the number of scanning lines of the dicing blade is two. When the grooves 160 are formed using a dicing blade, the number of scanning lines of the dicing blade is one. Thus, the number of lines is reduced. This simplifies the element embedding.

In the modified example shown in FIG. 10, the thickness TC2 of the second cover 36 of the insulation layer 30 may be changed in any manner. In an example, the thickness TC2 may be greater than or equal to the distance between the first resin side surface 23a of the first resin portion 20A of the encapsulation resin 20 and the second resin side surface 23b of the second resin portion 20B. That is, the side surface 33 of the insulation layer 30 (side surface of second cover 36)

may be flush with the second resin side surface 23b. The side surface 33 (side surface of second cover 36) may be disposed on the insulation layer 30 so as to project outward beyond the second resin side surfaces 23b.

In the embodiment and the modified examples, the dimension of the second cover 36 of the insulation layer 30 in the thickness-wise direction Z may be changed in any manner. The second cover 36 may be configured to cover part of the first resin side surface 23a of the first resin portion 20A located toward the resin back surface 22 in the thickness-wise direction Z.

Figure 14:
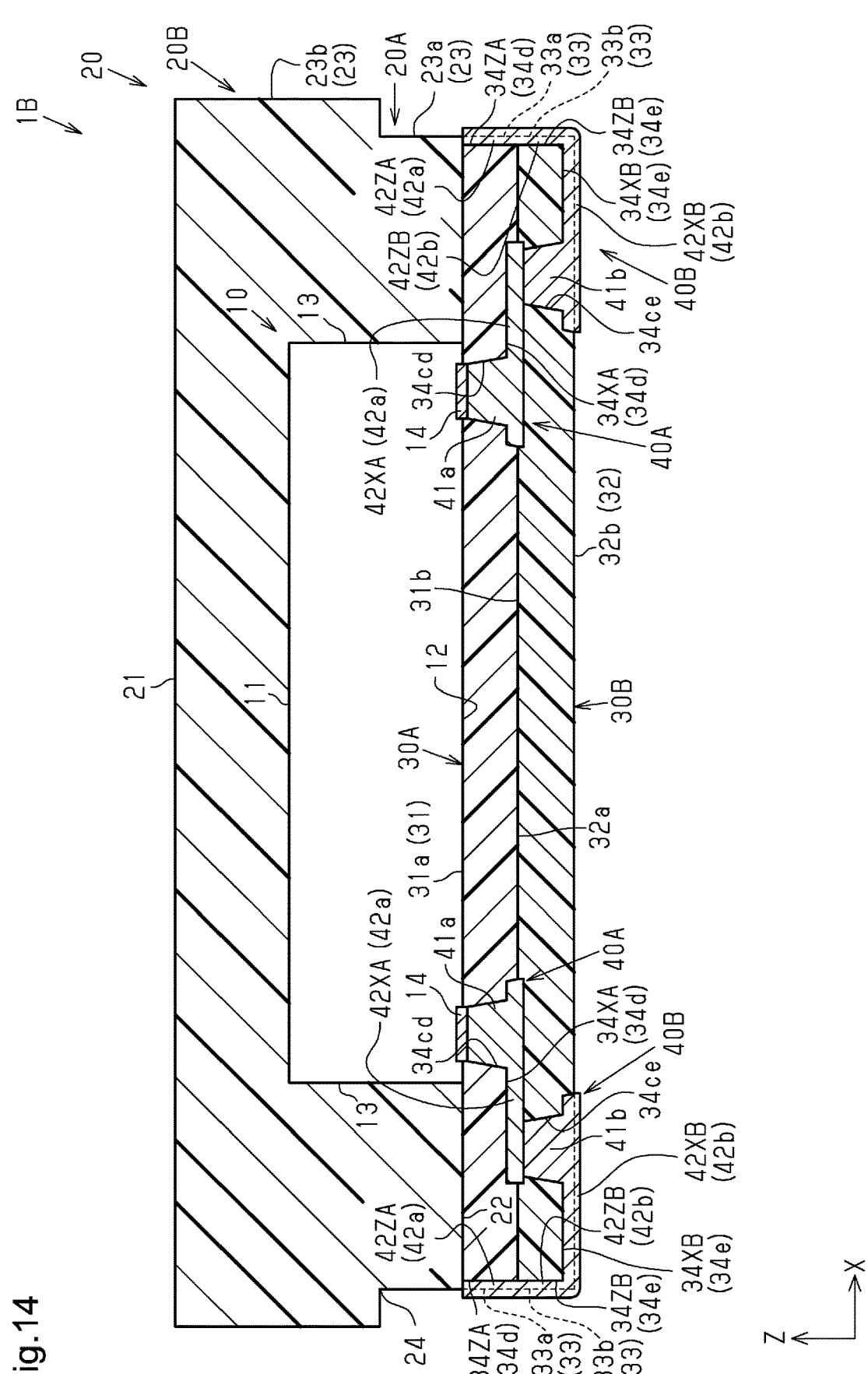
FIG. 14 is a schematic cross-sectional view showing a modified example of a semiconductor device.

In the embodiment, the insulation layer 30 has a single-layer structure. Instead, an insulation layer having a multi-layer structure may be used. FIG. 14 shows a semiconductor device 1B including a first insulation layer 30A and a second insulation layer 30B that are stacked in the thickness-wise direction Z. The first insulation layer 30A and the second insulation layer 30B are stacked on the encapsulation resin 20 in this order. The first insulation layer 30A is located closer to the semiconductor element 10 than the second insulation layer 30B. The first insulation layer 30A covers the element back surface 12 and the electrodes 14 of the semiconductor element 10 and the encapsulation resin 20. First wires 40A are formed of a metal film and disposed on the first insulation layer 30A. Second wires 40B are formed of a metal film and disposed on the second insulation layer 30B.

The first insulation layer 30A is formed from a material including a thermosetting synthetic resin and an additive containing a metallic element that forms part of the first wires 40A. The second insulation layer 30B is formed from a material including a thermosetting synthetic resin and an additive containing a metallic element that forms part of the second wire 40B. The thermosetting synthetic resin of the first insulation layer 30A and the second insulation layer 30B is, for example, an epoxy resin or a polyimide resin. Preferably, the first insulation layer 30A and the second insulation layer 30B are formed from the same material.

The first insulation layer 30A includes a first main surface 31a, a first back surface 32a, and first side surfaces 33a. The first main surface 31a and the first back surface 32a face in opposite directions in the thickness-wise direction Z. The first side surfaces 33a are formed between the first main surface 31a and the first back surface 32a in the thickness-wise direction Z. The first main surface 31a defines the main surface 31 of the insulation layer 30. Each first side surface 33a defines part of the side surfaces 33 of the insulation layer 30.

The first insulation layer 30A includes first grooves 34d, each of which includes a first back groove 34XA, which is recessed from the first back surface 32a of the first insulation layer 30A in the thickness-wise direction Z, and a first side groove 34ZA, which is recessed from the first side surfaces 33a of the first insulation layer 30A in a direction orthogonal to the thickness-wise direction Z (thickness-wise direction of first insulation layer 30A). A cross-sectional structure of the first back groove 34XA cut along a plane extending in the width-wise direction of the first back groove 34XA and the thickness-wise direction Z is the same as a cross-sectional structure of the back groove 34X in the embodiment cut along a plane extending in the width-wise direction of the back groove 34X and the thickness-wise direction Z. As shown in FIG. 14, as viewed in the thickness-wise direction Z, the first back grooves 34XA overlap the electrodes 14 of the semiconductor element 10. The first back groove 34XA is formed in the first back surface 32a from a part located inward from the electrode 14 of the semiconductor element 10 to a part located outward from the semiconductor element 10 and inward from the first side surface 33a.

A portion of each first back groove 34XA overlaps the electrode 14 of the semiconductor element 10 in the thickness-wise direction Z and has a hole 34cd, the wall surface of which is joined to the electrode 14. The hole 34cd is defined by a wall surface that is inclined so that the diameter of the hole 34cd is gradually increased from the first main surface 31a of the first insulation layer 30A (the main surface 31 of the insulation layer 30) to the first back surface 32a. The shape of the wall surface defining the hole 34cd is identical to the shape of the wall surface defining the hole 34c in the embodiment.

The first side groove 34ZA is not continuous with the first back groove 34XA. Among the first back grooves 34XA, the first side grooves 34ZA corresponding to the first back grooves 34XA extending in the width-wise direction X overlap with the first back grooves 34XA extending in the width-wise direction X as viewed in the width-wise direction X. The first side grooves 34ZA corresponding to the first back grooves 34XA extending in the width-wise direction X are separate in the width-wise direction X from the first back grooves 34XA extending in the width-wise direction X. Among the first back grooves 34XA, the first side grooves 34ZA corresponding to the first back grooves 34XA extending in the width-wise direction X overlap with the first back grooves 34XA extending in the width-wise direction X as viewed in the width-wise direction X. The first side grooves 34ZA are formed in a portion of the first side surface 33a of the first insulation layer 30A that is located inward from the first resin side surface 23a of the first resin portion 20A. The first side surface 33a of the first insulation layer 30A where the first side grooves 34ZA are not formed is flush with the first resin side surface 23a. The first side grooves 34ZA corresponding to the first back grooves 34XA extending in the width-wise direction X are separate in the width-wise direction X from the first back grooves 34XA extending in the width-wise direction X. The first side groove 34ZA is formed in the entirety of the first side surface 33a of the first insulation layer 30A in the thickness-wise direction Z. A cross-sectional structure of the first side groove 34ZA cut along a plane extending in a width-wise direction of the first side groove 34ZA and a direction orthogonal to the first side surface 33a and the width-wise direction is the same as a cross-sectional structure of the side groove 34Z of the embodiment cut along a plane extending in a width-wise direction of the side groove 34Z and a direction orthogonal to the side surfaces 33 and the width-wise direction.

Each first wire 40A includes a first embedded portion 41a and a first redistribution portion 42a. At least part of the first embedded portion 41a is embedded in the first insulation layer 30A. In FIG. 14, the first embedded portion 41a is entirely embedded in the first insulation layer 30A. The first embedded portion 41a is embedded in the hole 34cd. The first embedded portion 41a is joined to the electrode 14 of the semiconductor element 10. The first redistribution portion 42a is disposed on the first back surface 32a and is joined to the first embedded portion 41a. The first redistribution portion 42a is in contact with the first groove 34d. More specifically, the first redistribution portion 42a includes a first back redistribution portion 42XA, which is in contact with the first back groove 34XA, and a first side redistribution portion 42ZA, which is in contact with the first side groove 34ZA. The first back redistribution portion 42XA is separate from the first side redistribution portion 42ZA. In FIG. 14, the first back redistribution portion 42XA is in contact with the entirety of the first back groove 34XA in a direction in which the first back groove 34XA extends. Thus, the first back redistribution portion 42XA includes a portion located outward from the semiconductor element 10.

The second insulation layer 30B includes a second main surface 31b, a second back surface 32b, and second side surfaces 33b. The second main surface 31b and the second back surface 32b face in opposite directions in the thickness-wise direction Z. The second side surfaces 33b are formed between the second main surface 31b and the second back surface 32b in the thickness-wise direction Z. The second main surface 31b is in contact with the first back surface 32a of the first insulation layer 30A. The second back surface 32b defines the back surface 32 of the insulation layer 30. The second side surfaces 33b defines part of the side surfaces 33 of the insulation layer 30.

The second insulation layer 30B includes second grooves 34e, each of which includes a second back groove 34XB, which is recessed from the second back surface 32b of the second insulation layer 30B in the thickness-wise direction Z, and a second side groove 34ZB, which is recessed from the second side surface 33b of the second insulation layer 30B in a direction orthogonal to the thickness-wise direction Z (thickness-wise direction of the second insulation layer 30B). A cross-sectional structure of the second back groove 34XB cut along a plane extending in a width-wise direction of the second back groove 34XB and the thickness-wise direction Z is the same as a cross-sectional structure of the back groove 34X in the embodiment cut along a plane extending in a width-wise direction of the back groove 34X and the thickness-wise direction Z. As shown in FIG. 14, as viewed in the thickness-wise direction Z, the second back grooves 34XB overlap the first grooves 34d of the first insulation layer 30A. The second back groove 34XB is formed in the second back surface 32b from a part inward from the hole 34cd of the first groove 34d to a part outward from the first groove 34d.

A portion of each second back groove 34XB overlaps the hole 34cd of the second back groove 34X in the thickness-wise direction Z and has a hole 34ce continuous with the second back groove 34XB. The hole 34ce is defined by a wall surface that is tapered from the second back groove 34XB to the second main surface 31b of the second insulation layer 30B. The tapered shape of the hole 34ce is the same as the tapered shape of the hole 34c of the embodiment.

The second side groove 34ZB is continuous with the second back groove 34XB. The second side groove 34ZB is formed in the entirety of the second side surface 33b in the thickness-wise direction Z. The second side groove 34ZB is formed in a portion of the second side surface 33b of the second insulation layer 30B that is located inward from the first resin side surface 23a of the first resin portion 20A. The second side groove 34ZB is flush with the first side groove 34ZA of the first insulation layer 30A. The second side surface 33b of the second insulation layer 30B where the second side groove 34ZB is not formed is flush with the first resin side surface 23a. The second side groove 34ZB is continuous with the first side groove 34ZA. A cross-sectional structure of the second side groove 34ZB cut along a plane extending in a width-wise direction of the second side groove 34ZB and a direction orthogonal to the second side surface 33b and the width-wise direction is the same as a cross-sectional structure of the side groove 34Z of the embodiment cut along a plane extending in a width-wise direction of the side groove 34Z and a direction orthogonal to the side surface 33 and the width-wise direction.

Each second wire 40B includes a second embedded portion 41b and a second redistribution portion 42b. At least part of the second embedded portion 41b is embedded in the second insulation layer 30B. In FIG. 14, the second embedded portion 41b is entirety embedded in the second insulation layer 30B. The second embedded portion 41b is embedded in the hole 34ce. The second embedded portion 41b is joined to the first back redistribution portion 42XA of the first insulation layer 30A. The second redistribution portion 42b is disposed on the second back surface 32b and is joined to the second embedded portion 41b. The second redistribution portion 42b is located outward from the semiconductor element 10. The second redistribution portion 42b includes a portion located outward from the first redistribution portion 42a. The second redistribution portion 42b includes a second back redistribution portion 42XB disposed on the second back surface 32b and a second side redistribution portion 42ZB disposed on the second side surface 33b of the second insulation layer 30B. The second back redistribution portion 42XB is joined to the second side redistribution portion 42ZB. In FIG. 14, the second back redistribution portion 42XB is formed integrally with the second side redistribution portion 42ZB. When the first insulation layer 30A and the second insulation layer 30B are formed from the same material, since the first side redistribution portion 42ZA is joined to the second side redistribution portion 42ZB, the first side redistribution portion 42ZA may be considered to be part of the second redistribution portion 42b. Hence, the second redistribution portion 42b extends from the second back surface 32b of the second insulation layer 30B to the first side surface 33a of the first insulation layer 30A and the second side surface 33b of the second insulation layer 30B in the thickness-wise direction Z. In this case, the first redistribution portion 42a is formed on only the first back surface 32a of the first insulation layer 30A.

The second redistribution portion 42b is in contact with the second groove 34e. More specifically, the second back redistribution portion 42XB is in contact with the second back groove 34XB. The second side redistribution portion 42ZB is in contact with the second side groove 34ZB. In FIG. 14, the second side redistribution portion 42ZB is in contact with the entirety of the second side groove 34ZB in the thickness-wise direction Z. That is, the second side redistribution portion 42ZB is formed on the entirety of the second side surface 33b in the thickness-wise direction Z. The second side redistribution portion 42ZB is joined to the first side redistribution portion 42ZA of the first insulation layer 30A. In FIG. 14, the second side redistribution portion 42ZB is formed integrally with the first side redistribution portion 42ZA.

A method for forming the first embedded portion 41a and the first redistribution portion 42a of each first wire 40A and a method for forming the second embedded portion 41b and the second redistribution portion 42b of each second wire 40B are the same as the method for forming the embedded portion 41 and the redistribution portion 42 of each wire 40 of the embodiment. That is, each of the first embedded portion 41a, the first redistribution portion 42a, the second embedded portion 41b, and the second redistribution portion 42b is formed from the metal film including the base layer 43 and the plating layer 44 (refer to FIG. 5).

A method for manufacturing the semiconductor device 1B differs from the method for manufacturing the semiconductor device 1 of the embodiment in the insulation layer forming step, the side surface forming step, and the wire forming step. Specifically, the method for manufacturing the semiconductor device 1B includes a first insulation layer forming step of forming the first insulation layer 30A, a first wire forming step of forming the first back redistribution portion 42XA of the first wire 40A, a second insulation layer forming step of forming the second insulation layer 30B, and a second wire forming step of forming the second wire 40B and the first side redistribution portion 42ZA of the first wire 40A. In the method for manufacturing the semiconductor device 1B, the element embedding step, the first insulation layer forming step, the first wire forming step, the second insulation layer forming step, the side surface forming step, the second wire forming step, and the cutting step are sequentially performed. In the side surface forming step, the first side surfaces 33a of the first insulation layer 30A and the second side surfaces 33b of the second insulation layer 30B are formed. In the second wire forming step, the first side redistribution portion 42ZA of the first wire 40A and the second side redistribution portion 42ZB of the second wire 40B are formed.

In this structure, the first insulation layer 30A and the second insulation layer 30B form a multilayer structure. This allows the first wires 40A and the second wires 40B to be disposed in multiple layers in the thickness-wise direction Z. Thus, as viewed in the thickness-wise direction Z, the second back redistribution portions 42XB of the second wires 40B overlap with the first back redistribution portions 42XA of the first wires 40A. This allows for a complex wiring pattern as compared to a structure having a single insulation layer.

In addition, when the semiconductor device 1B is mounted on the wiring substrate CB with the solder SD (refer to FIG. 9), the solder SD is bonded to both the first side redistribution portion 42ZA of the first insulation layer 30A and the second side redistribution portion 42ZB of the second insulation layer 30B. Thus, the solder fillet SD1 (refer to FIG. 9) is increased in size. This facilitates exposure of the solder fillet SD1 from the step 24 of the encapsulation resin 20, thereby allowing for easy recognition of the mount state of the semiconductor device 1B on the wiring substrate CB.

In the semiconductor device 1B of the modified example shown in FIG. 14, the dimension of the first side redistribution portion 42ZA in the thickness-wise direction Z may be changed in any manner. In an example, the first side redistribution portion 42ZA may be formed from the second back surface 32b of the second insulation layer 30B to part of the first side surface 33a of the first insulation layer 30A in the thickness-wise direction Z. In this case, the first side groove 34ZA of the first insulation layer 30A is formed from the first back surface 32a of the first insulation layer 30A to part of the first side surface 33a in the thickness-wise direction Z.

Figure 15:
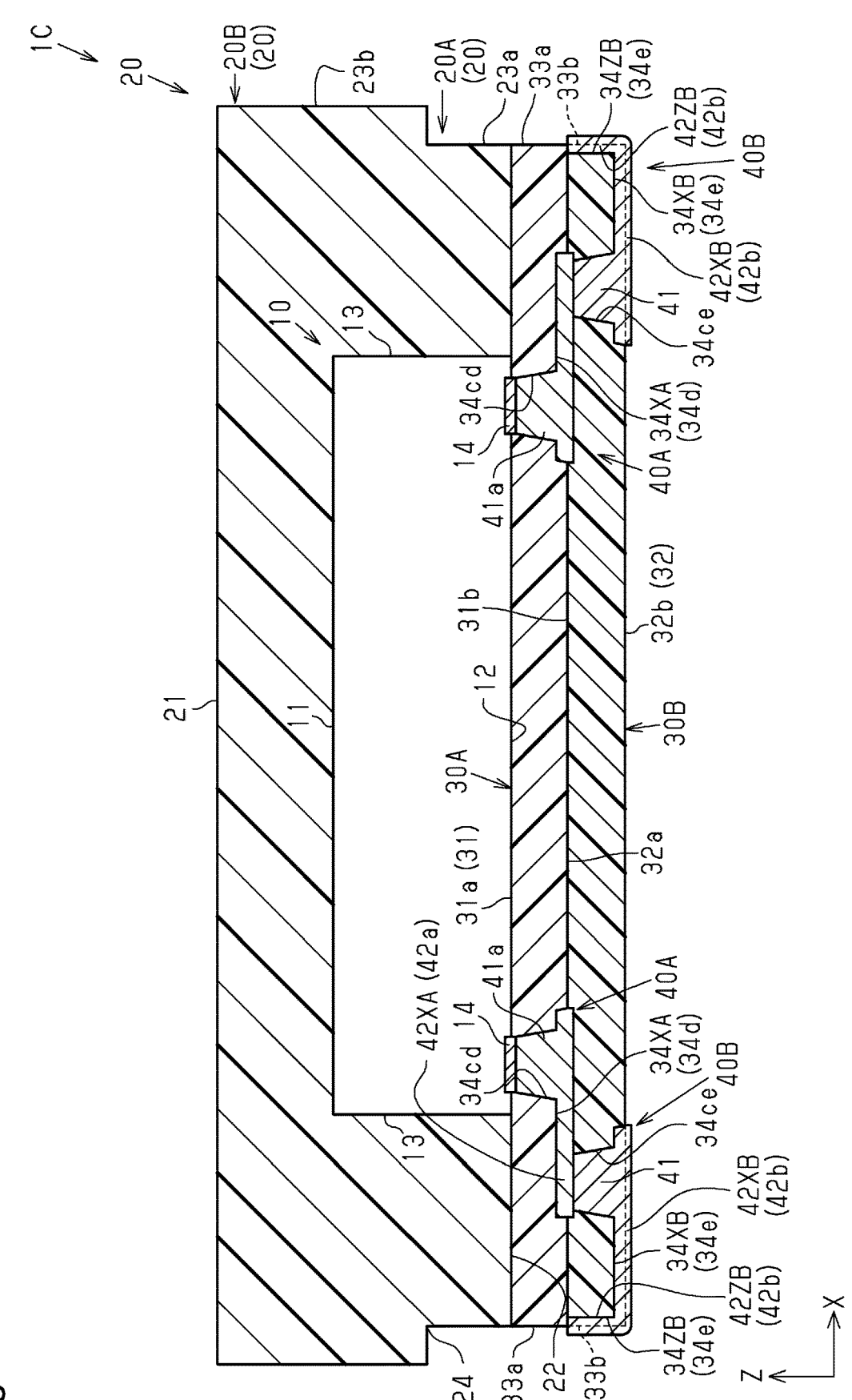
FIG. 15 is a schematic cross-sectional view showing a modified example of a semiconductor device.

As shown in a semiconductor device 1C in FIG. 15, the first side redistribution portion 42ZA may be omitted. That is, only the second side redistribution portion 42ZB may be formed. In this case, the first side groove 34ZA of the first insulation layer 30A is not formed. The first side surface 33a of the first insulation layer 30A is flush with the first resin side surface 23a of the first resin portion 20A.

In the semiconductor device 1C of the modified example shown in FIG. 15, the resin material forming the first insulation layer 30A may be changed in any manner. For example, the first insulation layer 30A may be formed from a material that does not include an additive including a metallic element that forms part of the first wire 40A. In this case, instead of a process for precipitating a base layer through laser beam processing, for example, a base layer may be vapor-deposited on the first back surface 32a of the first insulation layer 30A to form a thin metal film. Then, a plating layer is formed on the base layer to form the first wires 40A.

Figure 16:
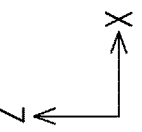
FIG. 16 is a schematic cross-sectional view showing a modified example of a semiconductor device.
Figure 17:
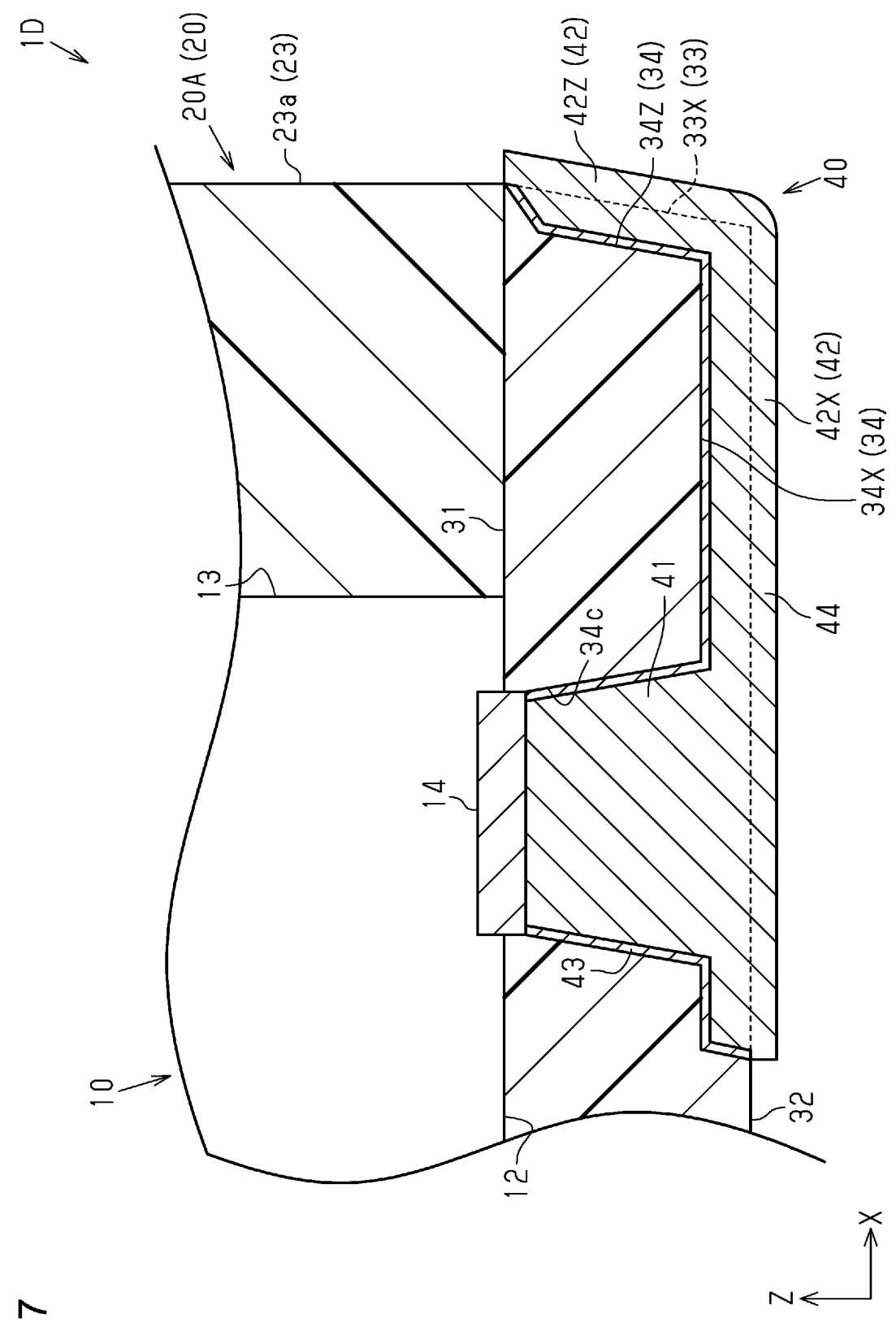
FIG. 17 is an enlarged view of FIG. 16 showing a portion of the wires and their surroundings.

In the semiconductor devices 1B and 1C of the modified examples shown in FIGS. 14 and 15, the insulation layers have a two-layer structure. Instead, insulation layers may have a multilayer structure having three or more layers. In the embodiment and the modified examples, the shape of the side surface 33 of the insulation layer 30 may be changed in any manner. In an example, as shown in a semiconductor device 1D in FIGS. 16 and 17, each side surface 33 includes an inclined surface 33x that is inclined with respect to the thickness-wise direction Z. The inclined surface 33x is inclined from the back surface 32 of the insulation layer 30 toward the main surface 31. In FIGS. 16 and 17, the side surface 33 is defined by the inclined surface 33x. Therefore, the side redistribution portion 42Z that is formed on the inclined surface 33x is inclined outward from the back surface 32 of the insulation layer 30 toward the main surface 31. Alternatively, part of the side surface 33 may be defined by the inclined surface 33x. When the insulation layer 30 has a structure of two or more layers, the inclined surface 33x is formed on the side surface 33 of an insulation layer 30 on which the side redistribution portion 42Z is formed.

In this structure, when the back surface 32 is irradiated with a laser beam in a direction orthogonal to the back surface 32 of the insulation layer 30 (the thickness-wise direction Z) to form the back groove 34X and the inclined surface 33x is irradiated with a laser beam without changing the irradiation direction of a laser beam, the side groove 34Z is formed in the inclined surface 33x. Thus, the wire forming step is simplified as compared to when the irradiation direction of a laser beam for forming the back groove 34X differs from the irradiation direction of a laser beam for forming the side groove 34Z.

In the embodiment and the modified examples, the step 24 may be omitted from the encapsulation resin 20. In this case, the separation between the first resin portion 20A and the second resin portion 20B is eliminated from the encapsulation resin 20. A step is formed between the insulation layer 30 and the encapsulation resin 20. More specifically, the difference in size between the insulation layer 30 and the encapsulation resin 20 forms a step in which the insulation layer 30 is recessed inward from the encapsulation resin 20. Thus, the side surfaces 33 of the insulation layer 30 are located inward from the resin side surfaces 23 of the encapsulation resin 20. In a method for manufacturing a semiconductor device having such a structure, in the side surface forming step, only the insulation layer 110 is cut and removed to form the separation slits 130. The separation slits 130 form the side surfaces 113 of the insulation layer 110 (the side surfaces 33 of the insulation layer 30). In the cutting step, only the encapsulation resin 100 is cut in the thickness-wise direction Z to form the step between the encapsulation resin 100 and the insulation layer 110 and the side surfaces of the encapsulation resin 100 (the resin side surfaces 23 of the encapsulation resin 20).

In the methods for manufacturing the semiconductor devices 1 and 1A to 1D of the embodiment and modified examples, the process for forming the wires 40 (the first wires 40A and the second wires 40B) may be changed in any manner. In a first example, the back surface 32 and the side surfaces 33 of the insulation layer 30 are printed in ink including metal particles to form the wires 40. The process for printing the back surface 32 and the side surfaces 33 in ink including metal particles is, for example, inkjet printing that ejects ink toward the back surface 32 and the side surfaces 33. In a second example, a metal film is entirely formed on the back surface 32 and the side surfaces 33 of the insulation layer 30, and then the metal film is removed from positions where the wires 40 are not be formed. Thus, the wires 40 are formed.

CLAUSES

The technical aspects that are understood from the embodiments and the modified examples will be described below.

Clause 1. A semiconductor device, comprising:

an insulation layer including a main surface, a back surface, and a side surface, the main surface and the back surface facing in opposite directions in a thickness-wise direction, and the side surface being formed between the main surface and the back surface in the thickness-wise direction;

wires including an embedded portion and a redistribution portion, at least part of the embedded portion being embedded in the insulation layer, and the redistribution portion being formed of a metal film joined to the embedded portion and formed from the back surface to the side surface;

a semiconductor element mounted on the main surface and including electrodes joined to at least part of the embedded portion of the wires; and an encapsulation resin in contact with the main surface and covering the semiconductor element.

Clause 2. The semiconductor device according to clause 1, wherein the insulation layer is formed from a material including a thermosetting synthetic resin and an additive including a metallic element forming a part of the wires.

Clause 3. The semiconductor device according to clause 1, wherein the redistribution portion is formed on an entirety of the side surface of the insulation layer in the thickness-wise direction.

Clause 4. The semiconductor device according to clause 1, wherein the encapsulation resin includes a first resin portion located toward the insulation layer in the thickness-wise direction, the first resin portion includes a first side surface facing in the same direction as the side surface of the insulation layer, the encapsulation resin includes a second resin portion located at a side opposite from the insulation layer in the thickness-wise direction, the second resin portion is greater in size than the first resin portion in a direction orthogonal to the thickness-wise direction, the second resin portion includes a second side surface facing in the same direction as the first side surface, and the first side surface of the first resin portion is located inward from the second side surface of the second resin portion.

Clause 5. The semiconductor device according to clause 4, wherein the encapsulation resin includes a step that is formed by a difference in size between the first resin portion and the second resin portion and recessed inside the encapsulation resin.

Clause 6. The semiconductor device according to clause 4, wherein the semiconductor element includes an element main surface and an element back surface facing in opposite directions, the electrodes are disposed on the element back surface, the semiconductor element is embedded in the encapsulation resin so that the element back surface and the electrodes are exposed, the insulation layer includes a first cover covering the element back surface and the electrodes of the semiconductor element and a second cover covering at least part of the first side surface of the first resin portion, and the second cover includes a side surface defining the side surface of the insulation layer.

Clause 7. The semiconductor device according to clause 1, wherein the side surface of the insulation layer includes an inclined surface inclined with respect to the thickness-wise direction.

Clause 8. The semiconductor device according to clause 1, wherein the insulation layer includes a groove including a back groove recessed from the back surface in the thickness-wise direction and a side groove recessed from the side surface in a direction orthogonal to the thickness-wise direction, and the redistribution portion is in contact with the groove.

Clause 9. The semiconductor device according to clause 8, wherein the insulation layer is formed from a material including a thermosetting synthetic resin and an additive including a metallic element forming a part of the wires, the redistribution portion includes a base layer in contact with the groove and a plating layer covering the base layer, and the base layer is formed of the metallic element included in the additive.

Clause 10. The semiconductor device according to clause 9, wherein the plating layer includes a valley recessed in a thickness-wise direction of the plating layer.

Clause 11. The semiconductor device according to clause 10, wherein the valley extends in a direction in which the redistribution portion extends.

Clause 12. A semiconductor device, comprising:

a first insulation layer including a first main surface, a first back surface, and a first side surface, the first main surface and the first back surface facing in opposite directions in a thickness-wise direction, and the first side surface being formed between the first main surface and the first back surface in the thickness-wise direction;

a second insulation layer stacked on the first insulation layer in the thickness-wise direction and including a second main surface, a second back surface, and a second side surface, the second main surface and the second back surface facing in opposite directions in the thickness-wise direction, and the second side surface being formed between the second main surface and the second back surface in the thickness-wise direction;

a first embedded portion at least partially embedded in the first insulation layer;

a first redistribution portion formed of a metal film joined to the first embedded portion and formed on at least the first back surface of the first insulation layer;

a second embedded portion at least partially embedded in the second insulation layer and joined to the first redistribution portion;

a second redistribution portion formed of a metal film joined to the second embedded portion and formed from the second back surface to the second side surface;

a semiconductor element mounted on the first main surface and including an electrode joined to at least part of the first embedded portion; and an encapsulation resin in contact with the first main surface and covering the semiconductor element.

Clause 13. The semiconductor device according to clause 12, wherein the first redistribution portion includes a first back redistribution portion formed on the first back surface and a first side redistribution portion separated from the first back redistribution portion and formed on the first side surface, the first back redistribution portion is joined to the second embedded portion, and the first side redistribution portion is joined to the second redistribution portion.

Clause 14. The semiconductor device according to clause 12, wherein the second redistribution portion includes a part overlapping the first redistribution portion as viewed in the thickness-wise direction.

Clause 15. The semiconductor device according to clause 12, wherein the second insulation layer is formed from a material including a thermosetting synthetic resin and an additive including a metallic element forming a part of the second embedded portion and a part of the second redistribution portion.

Clause 16. The semiconductor device according to clause 15, wherein the first insulation layer is formed from a material including a thermosetting synthetic resin and an additive including a metallic element forming a part of the first embedded portion and a part of the first redistribution portion.

Clause 17. The semiconductor device according to clause 12, wherein the first insulation layer includes a first groove recessed from the first back surface of the first insulation layer in the thickness-wise direction, the second insulation layer includes a second groove including a second back groove recessed from the second back surface of the second insulation layer in the thickness-wise direction and a second side groove recessed from the second side surface of the second insulation layer in a direction orthogonal to the second side surface, the first redistribution portion is in contact with the first groove, and the second redistribution portion is in contact with the second groove.

Clause 18. The semiconductor device according to clause 17, wherein the first groove includes a first back groove recessed from the first back surface of the first insulation layer in the thickness-wise direction and a first side groove recessed from the first side surface of the first insulation layer in a direction orthogonal to the first side surface, the first redistribution portion includes a first back redistribution portion in contact with the first back groove and a first side redistribution portion in contact with the first side groove and separate from the first back redistribution portion, and the second redistribution portion includes a second back redistribution portion in contact with the second back groove and joined to the first back redistribution portion and a second side redistribution portion in contact with the first side groove and joined to the second back redistribution portion and the first side redistribution portion.

Clause 19. A method for manufacturing a semiconductor device, the method comprising:

an element embedding step of embedding a semiconductor element in an encapsulation resin so that an electrode disposed on a side of the semiconductor element in a thickness-wise direction is exposed from a resin back surface;

an insulation layer forming step of forming an insulation layer including a main surface and a back surface facing in opposite directions, the main surface covering the resin back surface of the encapsulation resin and the electrode;

a side surface forming step of forming a side surface in the insulation layer that intersects the back surface; and a wire forming step of forming an embedded portion embedded in the insulation layer and joined to the electrode and a redistribution portion formed from the back surface to the side surface.

Clause 20. The method according to clause 19, wherein the insulation layer is formed from a material including a thermosetting synthetic resin and an additive including a metallic element forming a part of the embedded portion and a part of the redistribution portion, and the wire forming step includes a base layer forming step of forming a hole that exposes the electrode in the insulation layer and a groove that is recessed from the back surface and the side surface of the insulation layer and continuous with the hole using a laser while recognizing a position of the electrode from an image, thereby precipitating a base layer that covers a wall surface defining the hole and the groove, and a plating layer forming step of forming a plating layer covering the base layer.

Clause 21. The method according to clause 20, wherein in the plating layer forming step, the plating layer is formed through electroless plating.

Clause 22. The method according to clause 19, wherein in the element embedding step, semiconductor elements are embedded in the encapsulation resin, in the insulation layer forming step, the insulation layer is formed to cover the semiconductor elements, in the side surface forming step, after the insulation layer forming step, before the wire forming step, a portion of the insulation layer located between adjacent ones of the semiconductor elements is cut in the thickness-wise direction, and a portion of the encapsulation resin located between adjacent ones of the semiconductor elements is partially cut and removed in the thickness-wise direction to form a separation slit, the method further comprising a cutting step of cutting the portion of the encapsulation resin located between adjacent ones of the semiconductor elements to form semiconductor devices after the wire forming step.

Clause 23. The method according to clause 22, wherein in the side surface forming step, the separation slit forms a first resin side surface of a first resin portion, that is, a portion located toward the insulation layer in the thickness-wise direction, and in the cutting step, the encapsulation resin is cut from a bottom surface of the separation slit in the thickness-wise direction so that a step where the first resin portion is recessed is formed in the encapsulation resin and so that a second resin side surface of a second resin portion is formed, wherein the first resin portion and the second resin portion are located at opposite sides of the step in the thickness-wise direction.

Clause 24. The method according to clause 23, wherein the redistribution portion includes a side redistribution portion formed on the side surface of the insulation layer, and the side redistribution portion is located inward from the second resin side surface of the second resin portion.

Clause 25. The method according to clause 19, wherein in the wire forming step, the embedded portion and the redistribution portion are formed by printing the back surface and the side surface in ink including a metal particle.

Clause 26. The method according to clause 19, wherein in the wire forming step, a metal film is formed on the insulation layer, and then the metal film is removed from a location where the embedded portion and the redistribution portion are not to be formed, thereby forming the embedded portion and the redistribution portion.

DESCRIPTION OF THE REFERENCE NUMERALS 1, 1A to 1D) semiconductor device; 10) semiconductor element; 11) element main surface; 12) element back surface; 14) electrode; 20) encapsulation resin; 20A) first resin portion; 20B) second resin portion; 22) resin back surface; 23a) first resin side surface (side surface of first resin portion); 23b) second resin side surface (side surface of second resin portion); 24) step; 30) insulation layer; 30A) first insulation layer; 30B) second insulation layer; 31) main surface; 31a) first main surface; 31b) second main surface; 32) back surface; 32a) first back surface; 32b) second back surface; 33) side surface; 33a) first side surface; 33b) second side surface; 33x) inclined surface; 34) groove; 34X) back groove; 34XA) first back groove; 34XB) second back groove; 34Z) side groove 34ZA) first side groove 34ZB) second side groove; 34c) hole; 34d) first groove; 34e) second groove; 35) first cover; 36) second cover; 40) wires; 40A) first wire; 40B) second wire; 41) embedded portion; 41a) first embedded portion; 41b) second embedded portion; 42) redistribution portion; 42a) first redistribution portion; 42b) second redistribution portion; 42X) back redistribution portion; 42XA) first back redistribution portion; 42XB) second back redistribution portion; 42Z) side redistribution portion; 42ZA) first side redistribution portion; 42ZB) second side redistribution portion; 43) base layer; 44) plating layer; 45) valley; 100) encapsulation resin; 100A) first resin portion; 100xa) first resin side surface; 100B) second resin portion; 100xb) second resin side surface; 100bs) resin back surface; 101) step; 110) insulation layer: 111) main surface; 112) back surface; 113) side surface; 114) hole; 115) groove; 115X) back groove; 115Z) side groove; 116) first cover; 117) second cover; 120) wire; 120A) base layer; 120B) plating layer; 121) embedded portion; 122) redistribution portion; 122X) back redistribution portion; 122Z) side redistribution portion; 130) separation slit; 131) bottom surface; 150) separation slit; 151) bottom surface; Z) thickness-wise direction

The invention claimed is:

1. A semiconductor device, comprising:
an insulation layer including a main surface, a back surface, and a side surface,
the main surface and the back surface facing in opposite directions in a thickness-wise direction, and
the side surface being formed between the main surface and the back surface in the thickness-wise direction;
wires including an embedded portion and a redistribution portion, at least part of the embedded portion being embedded in the insulation layer, and
the redistribution portion being formed of a metal film joined to the embedded portion and continuously extending from the back surface to the side surface;
a semiconductor element mounted on the main surface and including electrodes joined to at least part of the embedded portion of the wires; and
an encapsulation resin in contact with the main surface and covering the semiconductor element, wherein
the redistribution portion includes a first portion extending along the side surface, and at least a part of a top surface of the first portion is in contact with the encapsulation resin at a boundary between the encapsulation resin and the insulation layer,
the encapsulation resin includes a first resin portion located toward the insulation layer in the thickness-wise direction,
the first resin portion includes a first side surface facing in the same direction as the side surface of the insulation layer,
the encapsulation resin includes a second resin portion located at a side opposite from the insulation layer in the thickness-wise direction,
the second resin portion is greater in size than the first resin portion in a direction orthogonal to the thickness-wise direction,
the second resin portion includes a second side surface facing in the same direction as the first side surface, and
the first side surface of the first resin portion is located inward from the second side surface of the second resin portion.

2. The semiconductor device according to claim 1, wherein the redistribution portion is formed on an entirety of the side surface of the insulation layer in the thickness-wise direction.

3. The semiconductor device according to claim 1, wherein the encapsulation resin includes a step that is formed by a difference in size between the first resin portion and the second resin portion and recessed inside the encapsulation resin.

4. The semiconductor device according to claim 1, wherein
the semiconductor element includes an element main surface and an element back surface facing in opposite directions,
the electrodes are disposed on the element back surface,
the semiconductor element is embedded in the encapsulation resin so that the element back surface and the electrodes are exposed,
the insulation layer includes a first cover covering the element back surface and the electrodes of the semiconductor element and a second cover covering at least part of the first side surface of the first resin portion, and
the second cover includes a side surface defining the side surface of the insulation layer.

5. The semiconductor device according to claim 1, wherein the side surface of the insulation layer includes an inclined surface inclined with respect to the thickness-wise direction.

6. The semiconductor device according to claim 1, wherein the insulation layer includes a groove including a back groove recessed from the back surface in the thickness-wise direction and a side groove recessed from the side surface in a direction orthogonal to the thickness-wise direction.

7. The semiconductor device according to claim 6, wherein
the insulation layer is formed from a material including a thermosetting synthetic resin and an additive including a metallic element forming a part of the wires,
the redistribution portion includes a base layer in contact with the groove and a plating layer covering the base layer, and
the base layer is formed of the metallic element included in the additive.

8. The semiconductor device according to claim 1, wherein the insulation layer is formed from a material including a thermosetting synthetic resin and an additive including a metallic element forming a part of the wires.

9. A method for manufacturing a semiconductor device, the method comprising:
an element embedding step of embedding a semiconductor element in an encapsulation resin so that an electrode disposed on a side of the semiconductor element in a thickness-wise direction is exposed from a resin back surface;
an insulation layer forming step of forming an insulation layer including a main surface and a back surface facing in opposite directions,
the main surface covering the resin back surface of the encapsulation resin and the electrode;
a side surface forming step of forming a side surface in the insulation layer that intersects the back surface; and
a wire forming step of forming an embedded portion embedded in the insulation layer and joined to the electrode and a redistribution portion continuously extending from the back surface to the side surface, wherein
the redistribution portion includes a first portion extending along the side surface, and at least a part of a top surface of the first portion is in contact with the encapsulation resin at a boundary between encapsulation resin and the insulation layer,
the insulation layer is formed from a material including a thermosetting synthetic resin and an additive including a metallic element forming a part of the embedded portion and a part of the redistribution portion, and
the wire forming step includes:
forming a hole that exposes the electrode in the insulation layer and a groove that is recessed from the back surface and the side surface of the insulation layer and continuous with the hole using a laser while recognizing a position of the electrode from an image, thereby precipitating a base layer that covers a wall surface defining the hole and the groove, and
a plating layer forming step of forming a plating layer covering the base layer.

10. The method according to claim 9, wherein in the plating layer forming step, the plating layer is formed through electroless plating.

11. A method for manufacturing a semiconductor device, the method comprising:
an element embedding step of embedding a semiconductor element in an encapsulation resin so that an electrode disposed on a side of the semiconductor element in a thickness-wise direction is exposed from a resin back surface;
an insulation layer forming step of forming an insulation layer including a main surface and a back surface facing in opposite directions, the main surface covering the resin back surface of the encapsulation resin and the electrode;
a side surface forming step of forming a side surface in the insulation layer that intersects the back surface;
a wire forming step of forming an embedded portion embedded in the insulation layer and joined to the electrode and a redistribution portion formed from the back surface to the side surface, wherein
in the element embedding step, semiconductor elements are embedded in the encapsulation resin,
in the insulation layer forming step, the insulation layer is formed to cover the semiconductor elements, and
in the side surface forming step, after the insulation layer forming step, before the wire forming step, a portion of the insulation layer located between adjacent ones of the semiconductor elements is cut in the thickness-wise direction, and a portion of the encapsulation resin located between adjacent ones of the semiconductor elements is partially cut and removed in the thickness-wise direction to form a separation slit; and
a cutting step of cutting the portion of the encapsulation resin located between adjacent ones of the semiconductor elements to form semiconductor devices after the wire forming step.

12. The method according to claim 11, wherein
in the side surface forming step, the separation slit forms a first resin side surface of a first resin portion that is a portion located toward the insulation layer in the thickness-wise direction, and
in the cutting step, the encapsulation resin is cut from a bottom surface of the separation slit in the thickness-wise direction so that a step where the first resin portion is recessed is formed in the encapsulation resin and so that a second resin side surface of a second resin portion is formed, wherein the first resin portion and the second resin portion are located at opposite sides of the step in the thickness-wise direction.

13. The method according to claim 12, wherein
the redistribution portion includes a side redistribution portion formed on the side surface of the insulation layer, and
the side redistribution portion is located inward from the second resin side surface of the second resin portion.

* * * * *